(12) United States Patent
Nakagawa et al.

(10) Patent No.: US 6,798,367 B2
(45) Date of Patent: Sep. 28, 2004

(54) SIZE-REDUCED MAJORITY CIRCUIT

(75) Inventors: Hiroshi Nakagawa, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/456,355

(22) Filed: Jun. 5, 2003

(65) Prior Publication Data

US 2003/0227403 A1 Dec. 11, 2003

(30) Foreign Application Priority Data

Jun. 6, 2002 (JP) ........................................ 2002-166210

(51) Int. Cl.[7] .............................................. H03M 1/66
(52) U.S. Cl. ...................... 341/144; 341/155; 341/160; 345/96; 345/204; 365/200
(58) Field of Search .......................... 341/144, 155–160

(56) References Cited

U.S. PATENT DOCUMENTS

| 4,600,916 A | * | 7/1986 | Masuda et al. ............. 341/159 |
| 4,667,337 A | * | 5/1987 | Fletcher ........................ 377/41 |
| 4,748,594 A | * | 5/1988 | Iida .............................. 365/200 |
| 4,897,657 A | * | 1/1990 | Brubaker ..................... 341/159 |
| 6,320,409 B1 | * | 11/2001 | Nakajima et al. ............. 326/36 |
| 6,348,915 B1 | * | 2/2002 | Yamashita et al. .......... 345/204 |
| 6,628,256 B2 | * | 9/2003 | Nishimura .................... 345/96 |

FOREIGN PATENT DOCUMENTS

| JP | 08-204562 | 8/1996 |
| JP | 09-064743 | 3/1997 |
| JP | 09-130250 | 5/1997 |
| JP | 2000-148605 | 5/2000 |
| JP | 2002-094380 | 3/2002 |

* cited by examiner

Primary Examiner—Michael Tokar
Assistant Examiner—Khai M. Nguyen
(74) Attorney, Agent, or Firm—Katten Muchin Zavis Rosenman

(57) ABSTRACT

A majority circuit for reduce a size thereof is provided. The majority circuit is composed of a D/A converter converting a plurality of binary signals to an analogue signal, a majority determining circuit responsive to said analogue signal to achieve a majority operation on said plurality of binary signals to produce a result signal representative of a result of said majority operation.

19 Claims, 13 Drawing Sheets

Fig. 4

| NUMBER OF DATA BITS THAT WILL BE FLIPPED | LEVELS OF SUM SIGNAL AND REFERENCE SIGNAL |
|---|---|
| 0 | $V_{SUM}(=V_{DD}-8 \cdot R \cdot I_{ON}) < V_{REF}(=V_{DD}-3.5 \cdot R \cdot I_{ON})$ |
| 1 | $V_{SUM}(=V_{DD}-7 \cdot R \cdot I_{ON}) < V_{REF}(=V_{DD}-3.5 \cdot R \cdot I_{ON})$ |
| 2 | $V_{SUM}(=V_{DD}-6 \cdot R \cdot I_{ON}) < V_{REF}(=V_{DD}-3.5 \cdot R \cdot I_{ON})$ |
| 3 | $V_{SUM}(=V_{DD}-5 \cdot R \cdot I_{ON}) < V_{REF}(=V_{DD}-3.5 \cdot R \cdot I_{ON})$ |
| 4 | $V_{SUM}(=V_{DD}-4 \cdot R \cdot I_{ON}) < V_{REF}(=V_{DD}-3.5 \cdot R \cdot I_{ON})$ |
| 5 | $V_{SUM}(=V_{DD}-3 \cdot R \cdot I_{ON}) > V_{REF}(=V_{DD}-3.5 \cdot R \cdot I_{ON})$ |
| 6 | $V_{SUM}(=V_{DD}-2 \cdot R \cdot I_{ON}) > V_{REF}(=V_{DD}-3.5 \cdot R \cdot I_{ON})$ |
| 7 | $V_{SUM}(=V_{DD}-1 \cdot R \cdot I_{ON}) > V_{REF}(=V_{DD}-3.5 \cdot R \cdot I_{ON})$ |
| 8 | $V_{SUM}(=V_{DD}-0 \cdot R \cdot I_{ON}) > V_{REF}(=V_{DD}-3.5 \cdot R \cdot I_{ON})$ |

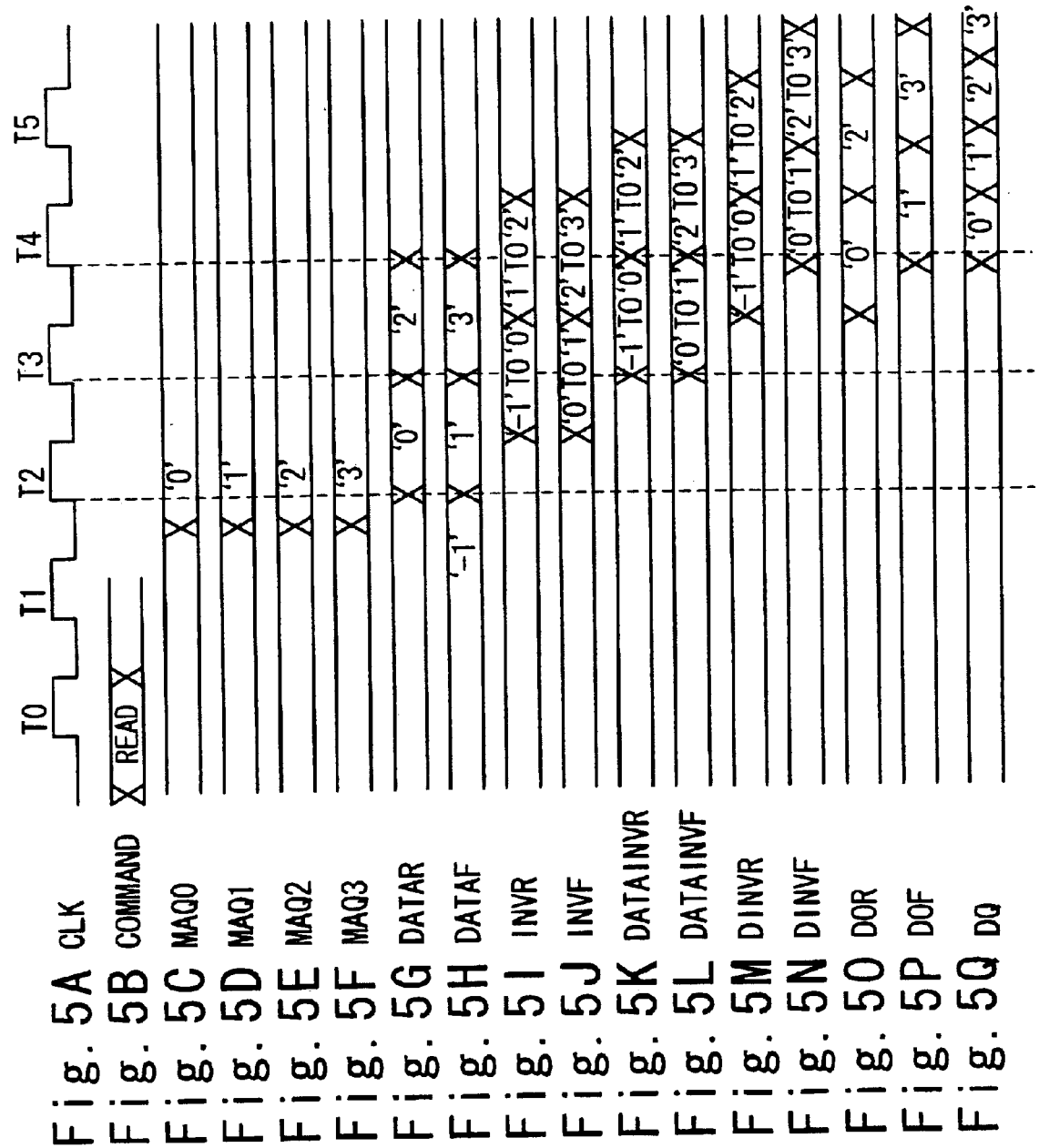

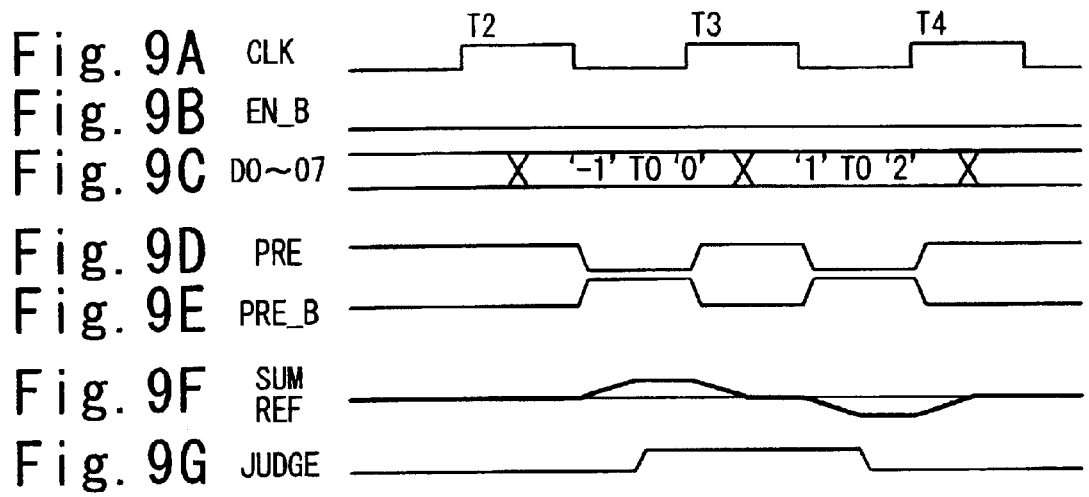
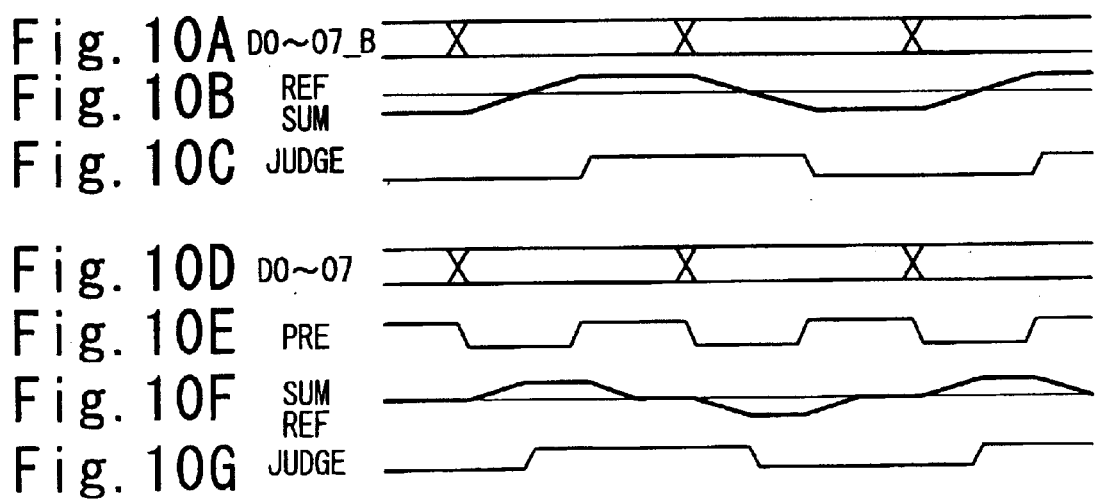

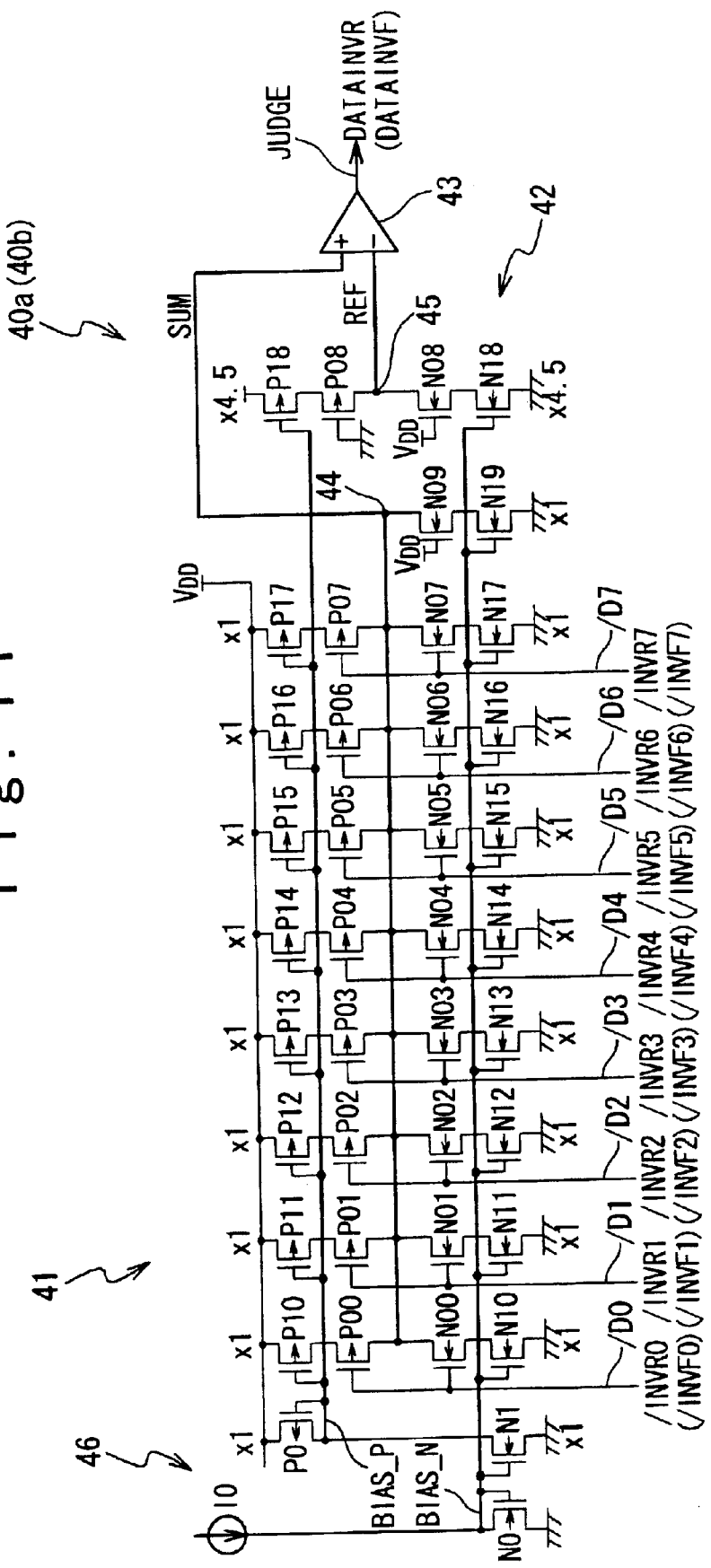

Fig. 12

| NUMBER OF DATA BITS THAT WILL BE FLIPPED | LEVELS OF SUM SIGNAL AND REFERENCE SIGNAL |
|---|---|
| 0 | $V_{SUM}(=V_{DOWN+9}) < V_{REF}(=V_{\pm 0})$ |
| 1 | $V_{SUM}(=V_{DOWN+7}) < V_{REF}(=V_{\pm 0})$ |
| 2 | $V_{SUM}(=V_{DOWN+5}) < V_{REF}(=V_{\pm 0})$ |
| 3 | $V_{SUM}(=V_{DOWN+3}) < V_{REF}(=V_{\pm 0})$ |
| 4 | $V_{SUM}(=V_{DOWN+1}) < V_{REF}(=V_{\pm 0})$ |
| 5 | $V_{SUM}(=V_{UP+1}) > V_{REF}(=V_{\pm 0})$ |
| 6 | $V_{SUM}(=V_{UP+3}) > V_{REF}(=V_{\pm 0})$ |
| 7 | $V_{SUM}(=V_{UP+5}) > V_{REF}(=V_{\pm 0})$ |
| 8 | $V_{SUM}(=V_{UP+7}) > V_{REF}(=V_{\pm 0})$ |

Fig. 14

| NUMBER OF DATA BITS THAT WILL BE FLIPPED | LEVELS OF SUM SIGNAL AND REFERENCE SIGNAL |
|---|---|
| 0 | $V_{SUM}(=V_{DOWN+9}) < V_{REF}(=V_{UP+9})$ |
| 1 | $V_{SUM}(=V_{DOWN+7}) < V_{REF}(=V_{UP+7})$ |
| 2 | $V_{SUM}(=V_{DOWN+5}) < V_{REF}(=V_{UP+5})$ |
| 3 | $V_{SUM}(=V_{DOWN+3}) < V_{REF}(=V_{UP+3})$ |
| 4 | $V_{SUM}(=V_{DOWN+1}) < V_{REF}(=V_{UP+1})$ |
| 5 | $V_{SUM}(=V_{UP+1}) > V_{REF}(=V_{DOWN+1})$ |
| 6 | $V_{SUM}(=V_{UP+3}) > V_{REF}(=V_{DOWN+3})$ |
| 7 | $V_{SUM}(=V_{UP+5}) > V_{REF}(=V_{DOWN+5})$ |
| 8 | $V_{SUM}(=V_{UP+7}) > V_{REF}(=V_{DOWN+7})$ | ized Majority Circuit

BACKGROUND OF THE INVENTION

1. Field of the Invention

The present invention is related to a majority circuit, especially suitable for data transfer adopting a data inversion technology.

2. Description of the Related Art

Memory devices which output many-bit data, such as 16-bit and 32-bit dynamic random access memories (DRAM), often suffer from switching noise caused by data flipping (or switching) during data transfer. An increase in the number of flipped data bits enhances generation of switching noises, and thus transferring many-bit data often generates considerable switching noise.

A data inversion technology is promising for reducing switching noises in memory devices. This technology alters the pattern of output data to minimize data flipping during read operations. An exemplary data inversion technology involves inverting all the data bits within the output data that will be outputted at the current clock cycle, when the majority of the data bits to be outputted at the current clock cycle are expected to be flip compared to the corresponding data bits outputted at the previous clock cycle.

The data inversion technology decreases the number of flipped data bits within the output data down to half or less of the number of all the data bits, and thereby effectively reduces switching noises. For example, the adoption of the data inversion technology to a 32-bit DRAM reduces the switching noise therefrom to be identical to that from a 16-bit DRAM which does not adopt the data inversion technology.

A memory device adopting a data inversion technology requires a majority circuit which determines whether the majority of the data bits that will be outputted at the current clock cycle will be flip compared to the corresponding data bits at the previous clock cycle.

FIG. 1 shows a typical 8-input majority circuit. The conventional majority circuit includes an OR gate 101, and a plurality of AND gates 102 connected to the OR gate 101. The number of the inputs of the OR gate 101 and the AND gates 102 is based on the number of the different combinations of the inputs of the majority circuit. The 8-input majority circuit requires the OR gate 101 to have as many as 70 inputs, the number of the inputs of the OR gate 101 being determined by $_8C_4$ (=70). Correspondingly, the majority circuit requires as many as 70 AND gates 102.

The conventional majority circuit suffers from a problem that an increase in the number of the inputs of the majority circuit increasingly enlarges the size of the majority circuit. The enlargement of the size of the majority circuit undesirably increases cost of the memory devices.

Various technologies are disclosed for reducing the size of a majority circuit. A size-reduced majority operation circuitry is disclosed in Japanese Open Laid Patent Application (Jp-A 2000-148605). The majority operation circuitry includes a plurality of m-input majority circuits, and an s-input majority circuit connected to the outputs of the m-input majority circuits, m being an integer equal to or more than 2, and s being the number of the m-input majority circuits. This architecture achieves a fast small input majority circuit.

Other size-reduced majority circuits are disclosed in Japanese Open Laid Patent Application (Jp-A Heisei 8-204562, Jp-A Heisei 9-64743, and Jp-A Heisei 9-130250). These size-reduced majority circuits include a plurality of switching elements respectively connected to a plurality of data inputs, a plurality of capacitors respectively connected to the first switching elements, and a sense amplifier connected to the capacitors. The output of the sense amplifier represents the result of a majority operation on the data inputs.

A D/A converter circuitry which may be related to the present invention is disclosed in Japanese Open Laid Patent Application (Jp-A 2002-94380). The D/A converter circuitry includes a plurality of D/A converters, a majority circuit, a selector connected to the outputs of the D/A converters. The majority circuit executes a majority operation on the outputs of the D/A converters to determine the broken D/A converter (s). The selector selects the output of well-behaved one of D/A converters.

SUMMARY OF THE INVENTION

Briefly, an object of the present invention is to provide an improved majority circuit, especially suitable for a memory device adopting a data inversion technology.

In detail, an object of the present invention is to reduce a size of a majority circuit.

Another object of the present invention is to reduce power consumption of a majority circuit.

Still another object of the present invention is to improve an operation speed of a majority circuit.

In an aspect of the present invention, a majority circuit is composed of a D/A converter converting a plurality of binary signals to an analogue signal, and a majority determining circuit responsive to the analogue signal to achieve a majority operation on the plurality of binary signals to produce a result signal representative of a result of the majority operation. The use of the D/A converter, which requires a reduced number of components, effectively reduces the size of the majority circuit.

The majority determining circuit preferably includes a reference signal generator generating a reference signal representative of a threshold of the majority operation, and a differential amplifier responsive to the analogue signal and the reference signal to develop the result signal.

The D/A converter may include a load resistor connected to a node, and a plurality of input transistors each connected to the node, the plurality of input transistors being responsive to the plurality of binary signals, respectively, for allowing currents to flow therethrough to develop the analogue signal on the node.

To reduce power consumption of the majority circuit, the D/A converter preferably includes a switching element which enables a current through the load resistor in response to an enable signal.

The reference signal generator may include a reference load resistor connected to a reference node, and a reference transistor connected to the reference node, the reference transistor allowing a reference current to flow therethrough to develop the reference signal on the reference node.

To reduce power consumption of the reference signal generator, the reference signal generator preferably includes a switching element which enables a current through the reference load resistor in response to an enable signal.

It is advantageous that the D/A converter further includes a plurality of first current mirror transistors respectively connected in series to the input transistors, the reference signal generator further includes a second current mirror transistor connected in series to the reference transistor, and the majority circuit further includes a bias circuit which provides a bias for each of the plurality of first current mirror transistors and the second current mirror transistor to control currents through the plurality of first current mirror transistors and the second current mirror transistors.

In the event that the bias circuit includes a bias transistor which forms a first current mirror with the plurality of first current mirror transistors, and forms a second current mirror with the second current mirror transistor, it is advantageous that a current mirror ratio of the second current mirror is 1/k times as large as a current mirror ratio of the first current mirror, the k being larger than 1, and a resistance of the reference load resistor is k times as large as a resistance of the load resistor within the D/A converter.

To improve operation speed of the majority circuit, it is preferable that the majority circuit further includes a precharge switching element between first and second inputs of the differential amplifier, respectively receiving the analogue signal and the reference signal, the precharge switching element being turned on to short-circuit the first and second inputs before the differential amplifier is enabled.

It is also preferable that the D/A converter includes a precharge control circuit which regulates a level of the analogue signal to that of the reference signal before the differential amplifier is enabled.

To increase the operation margin of the differential amplifier, the reference circuit preferably includes another D/A converter which receives complimentary input signals complimentary to the plurality of binary signals to output the reference signal so that the reference signal is complimentary to the analogue signal. In this case, the majority circuit preferably includes a resistor element disposed between first and second inputs of the differential amplifier, respectively receiving the analogue signal and the reference signal.

The reference circuit may include a first and second resistor elements connected in series between a power source supply and an earth terminal, and a reference node disposed between the first and second resistor, the reference signal being developed on the reference node.

The reference signal may be generated by an internal power source integrated within a same semiconductor within which the majority circuit is integrated.

To improve the operation speed of the majority circuit, the D/A converter preferably include a node on which the analogue signal is developed, a plurality of first input transistors for pulling up the node in response to the plurality of binary signals, respectively, and a plurality of second input transistors for pulling down the node in response to the plurality of binary signals, respectively.

In this case, the reference signal generator preferably includes a reference node on which the reference signal is developed, a plurality of first reference transistors for pulling up the reference node in response to a plurality of complimentary signals complimentary to the plurality of binary signals, respectively, and a plurality of second reference transistors for pulling down the reference node in response to the plurality of complimentary signals, respectively.

It is advantageous that the D/A converter further includes a plurality of first current mirror transistors connected in series to the plurality of first input transistors, respectively, and a plurality of second current mirror transistors connected in series to the plurality of second input transistors, respectively, and the majority circuit further includes a bias circuit which provides a first bias for the plurality of first current mirror transistors and a second bias for the plurality of second current mirror transistors so that currents through the plurality of first current mirror transistors are identical to currents through the plurality of second current mirror transistors.

In this case, the reference signal generator preferably includes a reference node on which the reference signal is developed, a plurality of first reference transistors for pulling up the reference node in response to a plurality of complimentary signals complimentary to the plurality of binary signals, respectively, and a plurality of second reference transistors for pulling down the reference node in response to the plurality of complimentary signals, respectively, a plurality of third current mirror transistors connected in series to the plurality of first reference transistors, respectively, and a plurality of fourth current mirror transistors connected in series to the plurality of second reference transistors, respectively, the bias circuit providing the first bias for the plurality of third current mirror transistors, and the second bias for the plurality of fourth current mirror transistors so that currents through the plurality of third and fourth current mirror transistors are identical to the currents through the plurality of first and second current mirror transistors.

BRIEF DESCRIPTION OF THE DRAWINGS

FIG. 4 shows an association of a number of data bits expected to be flipped to levels of a sum signal and a reference signal developed within the majority circuits in the first embodiment;

FIGS. 5A to 5Q are timing charts illustrating operations of the memory device;

FIGS. 9A to 9G are timing charts illustrating an operation of the majority circuit in the second embodiment;

FIGS. 10A to 10G are timing charts illustrating an effect of precharge executed by the majority circuit in the second embodiment;

FIG. 11 shows a circuit diagram of a majority circuit in a third embodiment;

FIG. 12 shows an association of a number of data bits expected to be flipped to levels of a sum signal and a reference signal developed within the majority circuits in the third embodiment;

FIG. 14 shows an association of a number of data bits expected to be flipped to levels of a sum signal and a reference signal developed within the majority circuits in the fourth embodiment.

DESCRIPTION OF THE PREFERRED EMBODIMENTS

Embodiments of the present invention will be described below in detail with reference to the attached drawings.

First Embodiment

Figure 1:
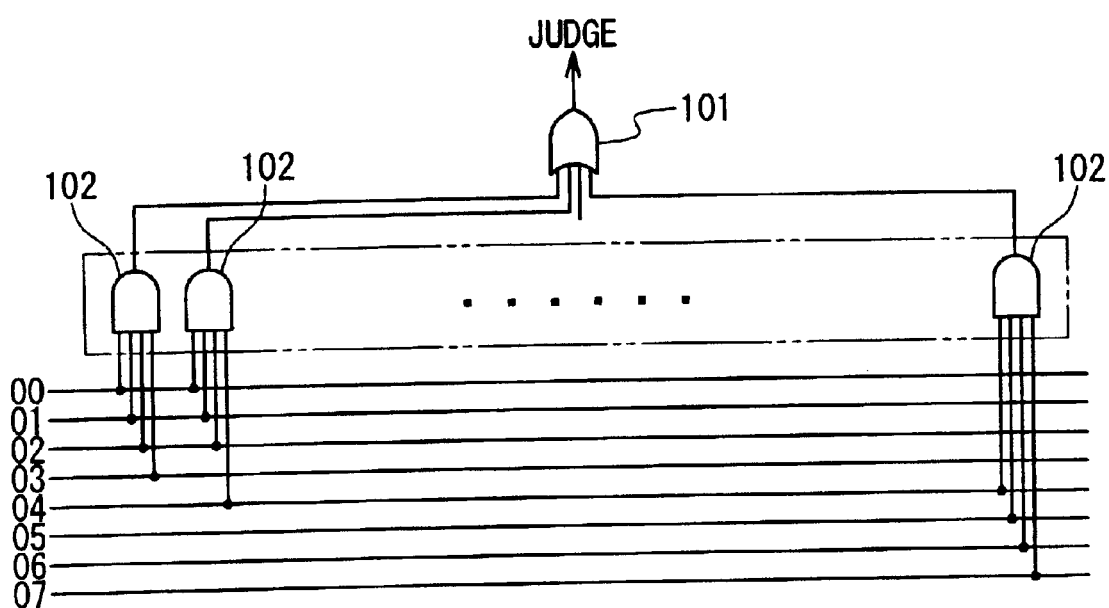
FIG. 1 shows a typical majority circuit.
Figure 2:
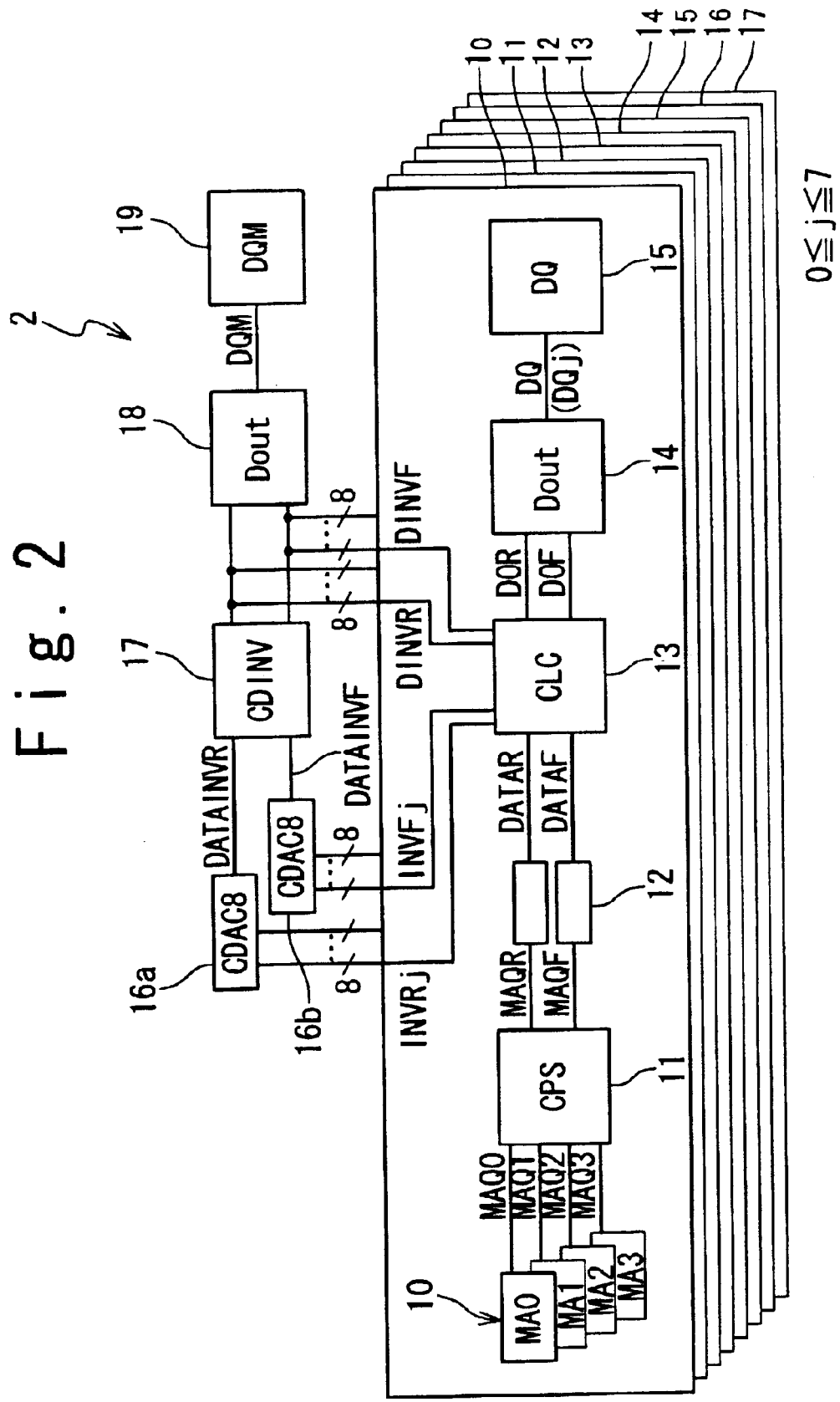
FIG. 2 shows a portion of a memory device including a pair of majority circuits in accordance with the present invention.

In a first embodiment, a pair of majority circuits in accordance with the present invention are provided for a 4-bit pre-fetch DDR SDRAM (double data rate synchronous dynamic random access memory) as shown in FIG. 2.

The memory device includes a plurality of read circuits 1, and a data inversion circuit 2. The number of the read circuits 1 is identical to the number of the data bits outputted in parallel from the memory device at the same time. In the first embodiment, the number of the read circuits 1 is eight. The read circuits 1 may be respectively denoted by numerals $1_0$ to $1_7$ to distinguish the read circuits 1 from each other.

Each read circuit 1 is designed to obtain four 1-bit data MAQ0 to MAQ3 from a memory array (not shown), to convert the data MAQ0 to MAQ3 into a serial data DQ, and to output the serial data DQ over four clock cycles during a read cycle through an associated output terminal 15. The serial data DQ outputted from the read circuit $1_j$ may be denoted by a numeral $DQ_j$ if necessary. The set of the eight serial data $DQ_0$ to $DQ_7$ constitute an 8-bit parallel output data.

The data inversion circuit 2 controls the read circuits 1 to achieve a data inversion technology. The data inversion circuit 2 generates data inversion flags DINVR and DINVF in response to the number of data bits within the 8-bit parallel output data that will be flipped at the current clock cycle compared to the corresponding data bits at the previous clock cycle. In response to the data inversion flags DINVR and DINVF, each read circuits 1 inverts the associated data bit that will be outputted therefrom at the current clock cycle.

The structures of the read circuits 1 and the data inversion circuit 2 are explained in detail below.

Each read circuit 1 includes main amplifier circuitry 10, a parallel-to-serial converter 11, a bus driver 12, and a latency latch and data inversion controller 13, and a parallel-to-serial converter 14.

The main amplifier circuitry 10 includes four main amplifier MA0 to MA3. The main amplifiers MA0 to MA3 respectively obtain four 1-bit data MAQ0 to MAQ3 from the memory array at the same clock cycle during a pre-fetch operation. The data MAQ0 to MAQ3 constitutes a 4-bit parallel data. The data MAQ0 to MAQ3 are eventually serially outputted as the serial data DQ onto the output terminal 15.

The parallel-to-serial converter 11 converts the data MAQ0 and MAQ2 into a serial data MAQR, while converting the data bit MAQ1 and MAQ3 into a serial data MAQF. The data MAQ0 and MAQ2, constituting the serial data MAQR, are outputted onto the output terminal 15 in synchronization with rising edges of the system clock, while the data MAQ1 and MAQ3, constituting the serial data MAQF, are outputted in synchronization with falling edges of the system clock. The serial data MAQR and MAQF are provided for the bus driver 12.

The bus driver 12 drives data buses DATAR and DATAF in response to the serial data MAQR and MAQF, respectively. The serial data MAQR and MAQF are transferred through the data buses DATAR and DATAF from the bus driver 12 to the latency latch and data inversion controller 13.

The latency latch and data inversion controller 13 detects data flipping in the serial data DQ on the basis of the serial data MAQR and MAQF to output binary data inversion signals INVR and INVF representative of whether data flipping will be occur in the serial data DQ. The data inversion signal INVR represents that data flipping will occur in the serial data DQ outputted in synchronization with the rising edges of the system clock, while the data inversion signal INVF represents that data flipping will occur in the serial data DQ outputted in synchronization with the falling edges of the system clock.

In detail, the latency latch and data inversion controller 13 stores the serial data MAQF previously inputted thereto. The latency latch and data inversion controller 13 receives the serial data MAQR and MAQF in synchronization with the rising edges of the system clock, and compares the serial data MAQR received at the current cycle to the previous serial data MAQF, that is, executes an exclusive OR operation on the current serial data MAQR and the previous serial data MAQF. The latency latch and data inversion controller 13 then produces the data inversion signal INVR so that the data inversion signal INVR represents the result of the comparison operation (or the exclusive OR operation).

On the other hand, the latency latch and data inversion controller 13 compares the serial data MAQF received at the current clock cycle to the serial data MAQR received at the current cycle, and produces the data inversion signal INVF so that the data inversion signal INVF represents the result of the comparison operation of the current serial data MAQR and the current serial data MAQF.

The data inversion signals INVR and INVF represent whether data flipping is expected to occur in the serial data DQ. The data inversion signals INVR and INVF are activated when data flipping is expected to occur in the serial data DQ. Alternatively, the data inversion signals INVR and INVF are deactivated, that is, pull down to the "low" level, when data flipping is not expected.

The data inversion signals INVR and INVF outputted from the each latency latch and data inversion controller 13 within the each read circuit 1 are provided for the data inversion circuit 2. The data inversion signal INVR from the read circuit $1_j$ may be denoted by the numeral $INVR_j$. Correspondingly, the data inversion signal INVF from the read circuit $1_j$ may be denoted by the numeral $INVF_j$.

In addition, the latency latch and data inversion controller 13 converts the data MAQR and MAQF into 2-bit parallel data consisting of a pair of 1-bit serial data DOR and DOF in response to the data inversion flags DINVR and DINVF from the data inversion circuit 2. The latency latch and data inversion controller 13 inverts the data MAQR to develop the data DOR in response to the data inversion flag DINVR being activated, while allowing the data DOR to be identical to the data MAQR in response to the flag DINVR being deactivated. Correspondingly, the latency latch and data inversion controller 13 inverts the data MAQF to develop the data DOF in response to the data inversion flag DINVF being activated, while allowing the data DOF to be identical to the data MAQF in response to the flag DINVF being deactivated.

The output buffer 14 converts the data DOR and DOQ into the serial data DQ. The serial data DQ is outputted to an external circuit through the output terminal 15.

The data inversion circuit 2 includes first and second majority circuits 16a, and 16b, a data inversion flag generator 17, an output buffer 18, and an output terminal 19.

The first majority circuit 16a is responsive to the data inversion signals $INVR_0$ to $INVR_7$ from the read circuits $1_0$ to $1_7$ to develop a result signal DATAINVR representative of whether the majority of the data bits within the 8-bit parallel output data will be flipped at a clock cycle associated with a rising edge of the system clock. If the first majority circuit 16a determines that the majority of data bits within the 8-bit parallel output data will be flipped, the result signal DATA-INVR is activated. If not so, the result signal DATAINVR is deactivated.

The second majority circuit 16b is responsive to the data inversion signals $INVF_0$ to $INVF_7$ from the respective read circuits 1 to develop a result signal DATAINVF representative of whether the majority of the data bits within the 8-bit parallel output data will be flipped at a clock cycle associated with a falling edge of the system clock. If the second majority circuit 16b determines that the majority of data bits within the 8-bit parallel output data be flipped, the result signal DATAINVF is activated. If not so, the result signal DATAINVF is deactivated.

The detail of the first and second majority circuit 16a and 16b are described later.

The data inversion flag generator 17 is responsive to the result signals DATAINVR and DATAINVF respectively received from the first and second majority circuits 16a and 16b for generating the data inversion flags DINVR and DINVF. As described, the data inversion flags DINVR and DINVF are provided for the latency latch and data inversion controllers 13 within the each read circuit 1.

The data inversion flag generator 17 also provides the data inversion flags DINVR and DINVF for the output buffer 18. The output buffer 18 outputs a flag DQM representative of whether the 8-bit parallel output data are inverted at the present cycle clock.

Figure 3:
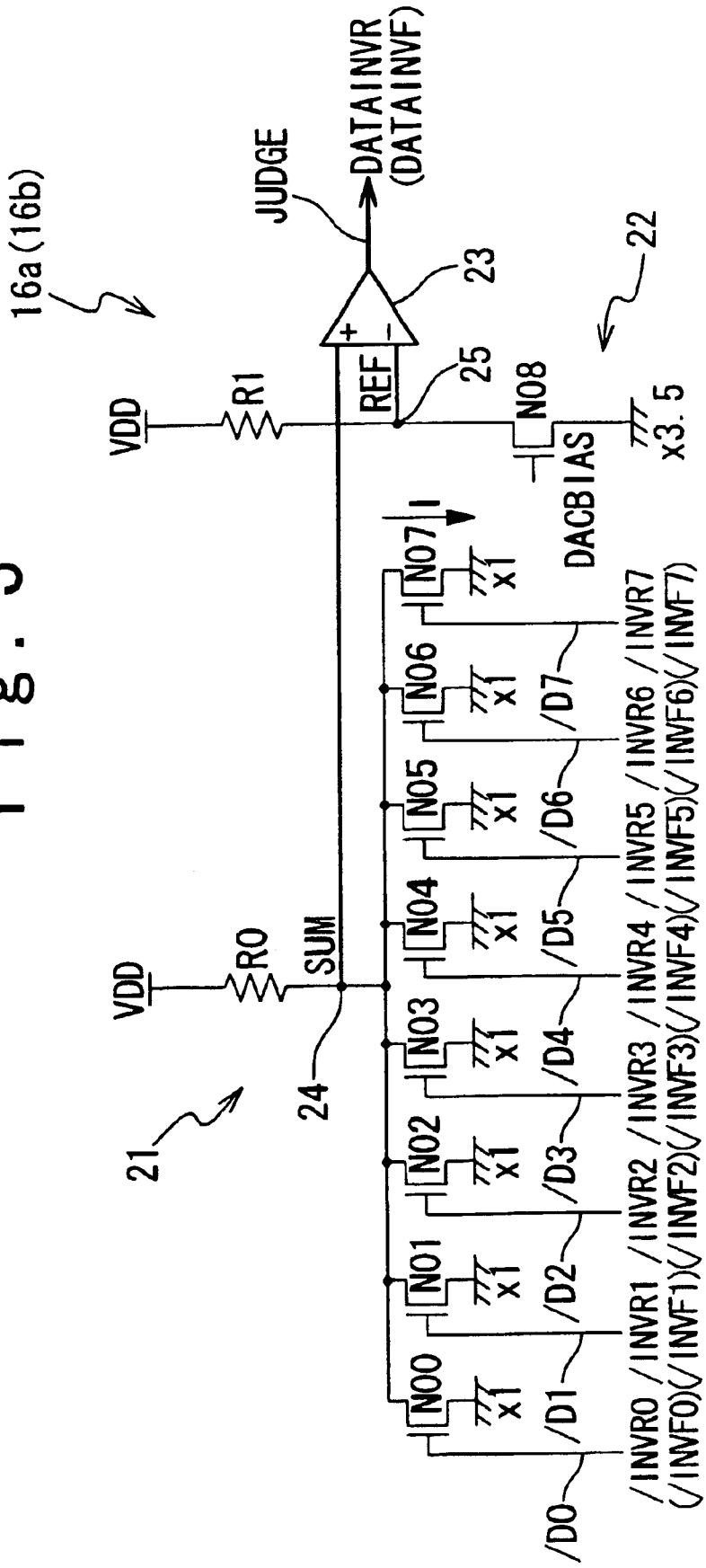
FIG. 3 shows a circuit diagram of the majority circuits in a first embodiment.

FIG. 3 shows a schematic circuit diagram of the first and second majority circuits 16a and 16b. The first majority circuit 16a includes an 8-bit D/A converter 21, a reference signal generator 22, and a differential amplifier 23.

The D/A converter 21 includes eight N-channel MOS transistors N00 to N07, and a load resistor R0. The N-channel MOS transistors N00 to N07 are designed to have the same turn-on current $I_{ON}$. The sources of the MOS transistors N00 to N07 are respectively connected to earth terminals. The drains of the MOS transistors N00 to N07 are connected to one terminal of the resistor R0 through a node 24. The other terminal of the load resistor R0 is connected to a power source supply $V_{DD}$. The node 24 is connected to an non-inverting input of the differential amplifier 23.

The gates of the MOS transistors N00 to N07 are respectively connected to inputs /D0 to /D7 which respectively receive data inversion signals $INVR_0$ to $INVF_7$ through inverters (not shown). That is, the data inversion signals $INVR_0$ to $INVF_7$ are inputted to the gates of the MOS transistor N00 to N07 after being inverted. The inverted data inversion signals $INVR_0$ to $INVF_7$ are respectively referred to as data inversion signals $/INVR_0$ to $/INVF_7$, hereinafter.

The D/A converter 21 develops a current through the load resistor R0 in response to the number of the activated ones of the data inversion signals $/INVR_0$ to $/INVF_7$, that is, the number of the deactivated ones of the data inversion signals $INVR_0$ to $INVF_7$. This implies that the current through the load resistor R0 decreases as the increase in the number of the data bits within the 8-bit parallel output data that will be flipped in synchronization with the associated rising edge.

The current through the load resistor R0 develops a sum signal SUM on the node 24. The level of the sum signal SUM proportionately increases as the increase in the number of the data bits within the 8-bit parallel output data that will be flipped.

The reference signal generator 23 includes a MOS transistor N08 and a load resistor R1. The source of the MOS transistor N08 is connected to an earth terminal. The drain of the MOS transistor N08 is connected to one terminal of the load resistor R1 through a node 25. The other terminal of the load resistor R1 is connected to a power source supply $V_{DD}$. The node 25 is connected to an inverting input of the differential amplifier 23.

The MOS transistor N08 receives a bias DACBIAS on the gate to allow a reference current to flow through the load resistor R1. The bias DACBIAS is regulated to allow the reference current to be 3.5 times as large as the turn-on current of the MOS transistors N00 to N07.

The reference current flowing through the load resistor R1 develops a reference signal REF on the node 25, which represents a threshold of the majority operation of the majority circuit 16a.

The differential amplifier 23 compares the sum signal SUM on the non-inverting input to the reference signal REF on the inverting input to produce the result signal DATA-INVR on the output terminal JUDGE. The result signal DATAINVR is representative of the result of the majority operation on the data inversion signals $/INVR_0$ to $/INVF_7$, that is, the result of the judgement on whether the majority of the data bits within the 8-bit parallel output data will be flipped in synchronization with the current rising edge of the system clock.

FIG. 4 is a table illustrating the association of the number of the data bits that will be flipped to the levels of the sum signal SUM and the reference signal REF, where R is the resistance of the load resistors R0 and R1, $I_{ON}$ is the turn-on current of the MOS transistors N00 to N07, $V_{SUM}$ is the level of the sum signal SUM, and $V_{REF}$ is the level of the reference signal REF. When the number of the flipped data bits is equal to or less than 4, it holds:

$$V_{SUM} < V_{REF},$$

while the number of the flipped data bits is equal to or more than 5, it holds:

$$V_{SUM} > V_{REF}.$$

This implies that comparing the level $V_{SUM}$ to $V_{REF}$ achieves the majority operation to determine whether the majority of the data bits within the 8-bit parallel output data will be flipped.

The second majority circuit 16b is identical to the first majority circuit 16a except that the second majority circuit 16b receives the data inversion signals $INVF_0$ to $INVF_7$ in place of the signals $INVR_0$ to $INVR_7$ and outputs the result signal DATAINVF in place of the result signal DATAINVR. The result signal DATAINVF is representative of whether the majority of the data bits within the 8-bit parallel output data will be flipped in synchronization with the current falling edge of the system clock.

This architecture of the majority circuits 16a and 16b effectively reduces the size thereof because of the adoption of a D/A converter. A D/A converter is easy to be reduced in size due to its simple architecture. The simplicity of the D/A converter allows the majority circuits 16a and 16b to be constituted by not so many components, and thereby reduced in size.

One skilled in the art would appreciate that the majority circuits 16a and 16b may be constituted by P-channel MOS transistors in place of the N-channel MOS transistors. In addition, one skilled in the art would appreciate that diode-connected MOS transistors may be used as the load resistors R0 and R1.

FIGS. 5A to 5Q shows a timing chart illustrating the operation of the read circuits 1 and the data inversion circuit 2. As shown in FIG. 5A and 5B, a read cycle begins with providing a read command in synchronization with a rising edge of a clock pulse T0 within the system clock CLK. In response to the input of the read command, as shown in FIGS. 5C to 5F, four data bits "0" to "3" are obtained from the memory cell array through the main amplifier 10 to respectively develop the data MAQ0 to MAQ3. The data MAQ0 to MAQ3 respectively consists of the data bits "0", "1", "2", and "3". The data bits "0", "1", "2", and "3" are sent to the parallel-to-serial converter 11. The data bits "0", "1", "2", and "3" will be outputted through the output terminal 15 in the order named, as described later.

As shown in FIGS. 5G and 5H, the parallel-to-serial converter 11 converts the data MAQ0 to MAQ3, consisting of the data bits "0" to "3", into the data MAQR and MAQF, and outputs the data MAQR and MQAF to the latency latch and data inversion controller 13 through the data buses DATAR and DATAF, respectively.

The data bits "0" and "1" are transferred to the latency latch and data inversion controller 13 in synchronization with the rising edge of the clock pulse T2.

In response to the rising edge of the clock pulse T2, as shown in FIG. 5I, the latency latch and data inversion controller 13 compares the data bit "0" to the data bit "−1", which is finally outputted during the previous read cycle, to develop the data inversion signal INVR. In other words, the controller 13 executes an exclusive OR operation on the data bit "0" and the data bit "−1", and outputs the data inversion signal INVR representative of the result of the exclusive OR operation. The data inversion signal INVR represents whether data flipping is expected when the data bit "0" is outputted.

Correspondingly, as shown in FIG. 5J, the latency latch and data inversion controller 13 compares the data bit "1" to the data bit "0", both of which are received in synchronization with the clock pulse T2, to develop the data inversion signal INVF. The data inversion signal INVR represents whether data flipping is expected when the data bit "1" is outputted after the data bit "0".

In response to the falling edge of the clock pulse T2, as shown in FIGS. 5K and 5L, the majority circuits 16a and 16b respectively receive the data inversion signals INVR and INVF from each read circuit 1, and determine whether the majority of the serial data $DQ_0$ to $DQ_7$ to be outputted from the read circuits $1_0$ to $1_7$ will be flipped to respectively output the data bits "1" therefrom to develop the result signals DATAINVR and DATAINVF. The majority circuit 16a develops the result signal DATAINVR so as to represent the result of majority operation on the data inversion signals $INVR_0$ to $INVR_7$, while the majority circuit 16b develops the result signal DATAINVF so as to represent the result of majority operation on the data inversion signals $INVF_0$ to $INVF_7$.

The result signals DATAINVR and DATAINVF are outputted to be stored in latches (not shown) in response to the rising edge of the following clock pulse T3. This implies that the majority circuits 16a and 16b are required to complete the majority operations in a half of the cycle of the system clock. The result signals DATAINVR and DATAINVF are outputted to the data inversion flag generator 17.

As shown in FIGS. 5M and 5N, in response to the result signal DATAINVR, the data inversion flag generator 17 outputs the data inversion flag DINVR in synchronization with the falling edge of the clock signal T3. If the data inversion flag DINVR is activated, the latency latch and data inversion controller 13 inverts the data bit "0" to develop the data DOR. If not so, the latency latch and data inversion controller 13 outputs the non-inverted data bit "0" as the data DOR.

Correspondingly, in response to the result signal DATAINVF, the data inversion flag generator 17 outputs the data inversion flag DINVF in synchronization with the rising edge of the following clock signal T4. If the data inversion flag DINVF is activated, the latency latch and data inversion controller 13 inverts the data bit "1" to develop the data DOF. If not so, the latency latch and data inversion controller 13 outputs the non-inverted data bit "1" as the data DOF.

The parallel-to-serial converter 14, as shown in FIG. 5Q, converts the data DOR and DOF into the serial data DQ, and outputs the serial data DQ. This results in that the data bit "0" is firstly outputted from the output terminal 15, and the data bit "0" is then outputted. The data inversion flags DINVR and DINVF are sequentially outputted as the flag DQM by output buffer 18 in synchronization with the output of the data bits "0" and "1".

The same goes for the data bits "2" and "3". The data bits "2" and "3" are transferred to the latency latch and data inversion controller 13 in synchronization with the rising edge of the clock pulse T3.

In response to the clock pulse T3, as shown in FIG. 5I, the latency latch and data inversion controller 13 compares the data bit "2" to the data bit "1", which is previously received in synchronization with the clock pulse T2, to develop the data inversion signal INVR.

Correspondingly, as shown in FIG. 5J, the latency latch and data inversion controller 13 compares the data bit "3" to the data bit "2" to develop the data inversion signal INVF.

In response to the falling edge of the clock pulse T3, as shown in FIGS. 5K and 5L, the majority circuits 16a and 16b respectively receive the data inversion signals INVR and INVF from each read circuit 1 to develop the result signals DATAINVR and DATAINVF.

As shown in FIGS. 5M and 5N, in response to the result signal DATAINVR, which is representative of the majority operation on the data inversion signals INVR at the falling edge of the clock pulse T3, the data inversion flag generator 17 outputs the data inversion flag DINVR in synchronization with the falling edge of the clock signal T4. In response to the data inversion flag DINVR, the latency latch and data inversion controller 13 develops the data DOR with the data bit "2" inverted or not inverted.

Correspondingly, in response to the result signal DATAINVF, which is representative of the majority operation on the data inversion signals INVF at the falling edge of the clock pulse T3, the data inversion flag generator 17 outputs the data inversion flag DINVF in synchronization with the rising edge of the following clock signal T5. In response to the data inversion flag DINVF, the latency latch and data inversion controller 13 develops the data DOF with the data bit "3" inverted or not inverted.

The parallel-to-serial converter 14, as shown in FIG. 5Q, converts the data DOR and DOF into the serial data DQ, and outputs the serial data DQ. This results in that the data bit "2" is outputted from the output terminal 15 after the data bit "1", and the data bit "3" is then outputted. The data inversion flags DINVR and DINVF are sequentially outputted as the flag DQM by output buffer 18 in synchronization with the output of the data bits "2" and "3".

The architecture thus-described allows a majority circuit to include the reduced number of components, because of the use of a D/A converter. This advantageously reduces the size of the majority circuit.

Figure 6:
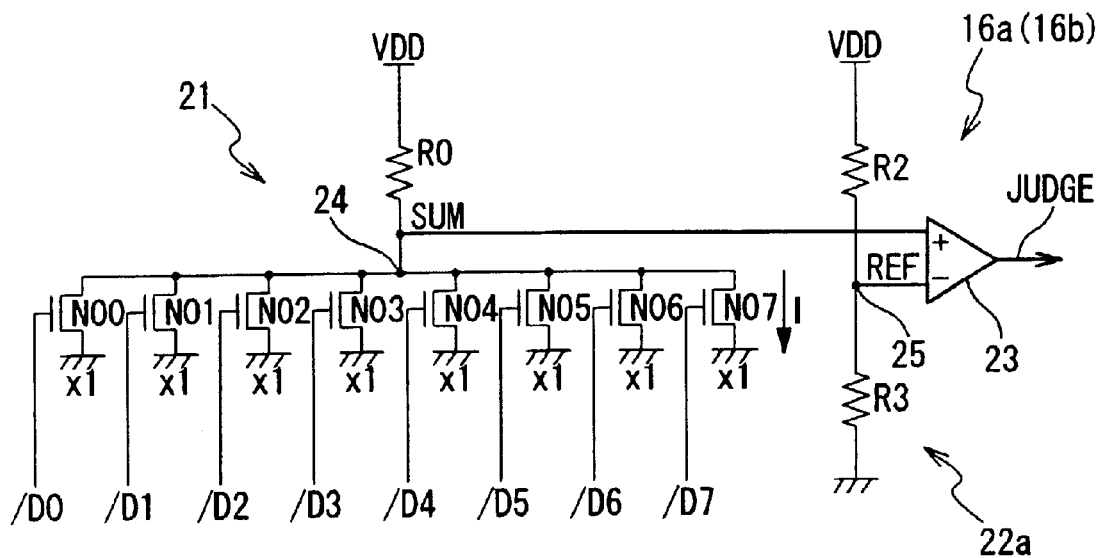
FIG. 6 shows a modification of the majority circuit in the first embodiment.

In a modification of the first embodiment, as shown in FIG. 6, the reference circuit 22 may be replaced with a reference circuit 22a which includes a pair of serially connected resistors R2 and R3 between a power supply source $V_{DD}$ and an earth terminal. The node 25 is disposed between the resistors R2 and R3, and the reference signal REF is developed on the node 25.

Figure 7:
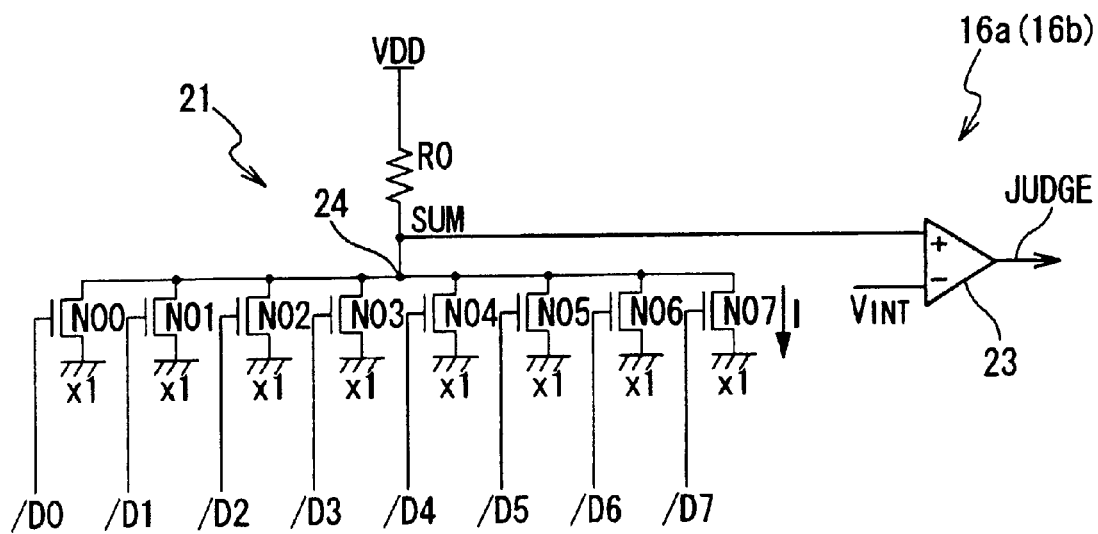
FIG. 7 shows another modification of the majority circuit in the first embodiment.

In another modification of the first embodiment, as shown in FIG. 7, the reference voltage REF is generated by an internal power source supply integrated within the semiconductor chip within which the memory device is integrated.

Second embodiment

Figure 8:
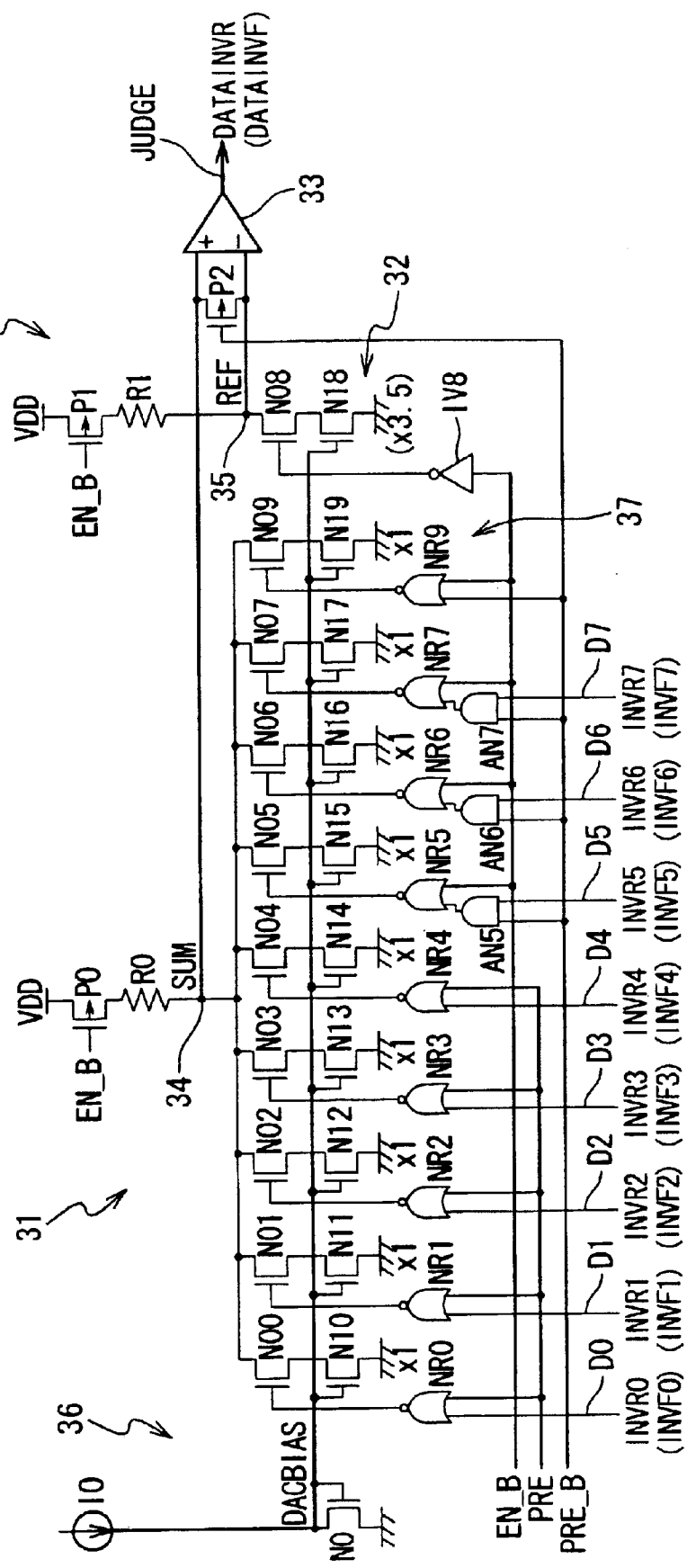
FIG. 8 shows a circuit diagram of a majority circuit in a second embodiment.

In a second embodiment, the majority circuits 16a and 16b are modified to reduce power consumption and improve operation speed as shown in FIG. 8. The modified majority circuits 16a and 16b are referred to as majority circuits 30a and 30b hereinafter. The majority circuits 30a and 30b have the same structure except for that the majority circuit 30a receives the data inversion signals $INVR_0$ to $INVR_7$ while the majority circuit 30b receives the data inversion signals $INVF_0$ to $INVF_7$, and that the majority circuits 30a outputs the result signal DATAINVR, while the majority circuits 30b outputs the result signal DATAINVF. Therefore, each of the majority circuits 30a and 30b may be referred to as a majority circuit 30.

Each majority circuit 30 includes a D/A converter 31, a reference signal generator 32, and a differential amplifier 33. The D/A converter 31 and the reference signal generator 32 are different from those disclosed in the first embodiment in the fact described below.

First, a bias circuit 36 is used to control the currents through the D/A converter 31, and the reference signal generator 32.

The bias circuit 36 includes an N-channel MOS transistor N0 and a constant current source I0 providing the drain of the MOS transistor N0 with a constant current. The source of the MOS transistor N0 is connected to an earth terminal, while the gate of the MOS transistor N0 are connected to the drain of the MOS transistor N0. A constant bias DACBIAS is developed on the drain of the MOS transistor N0.

The drain of the MOS transistor N0 is connected to the gates of the N-channel MOS transistors N10 to N17 respectively disposed between the sources of the MOS transistors N00 to N07 between the associated earth terminals to provide the constant bias DACBIAS for the gates of the N-channel MOS transistors N10 to N17. The MOS transistor N0 and the MOS transistors N10 to N17 form a current mirror, and thus the currents through the MOS transistors N10 to N17 are regulated to be $A_0$ times as large as the current through the MOS transistor N0, $A_0$ being the current mirror ratio with respect to the MOS transistors N10 to N17.

The drain of the MOS transistor N0 is also connected to the gate of the N-channel MOS transistor N18 disposed between the source of the MOS transistors N08 between the earth terminal to provide the constant bias DACBIAS for the gate of the N-channel MOS transistor N18. The MOS transistor N0 and the MOS transistor N18 form a current mirror, and thus the reference current through the MOS transistors N18 is regulated to be $A_2$ times as large as the current through the MOS transistor N0, $A_1$ being the current mirror ratio with respect to the MOS transistor N18.

This architecture effectively improves the reliability of the majority circuit 30 by regulating the currents through the D/A converter 31 and the reference circuit 32.

To reduce the reference current through the reference signal generator 32, the current mirror ratio $A_1$, and the resistance $R_1$ of the load resistor R1 are defined as follows: the current mirror ratio $A_1$ is designed to be 1/k times as large as the current mirror ratio $A_0$ with respect to the MOS transistors N10 to N17, and the resistance $R_1$ is designed to be k times as large as the resistance $R_0$ of the load resistor R0, where k is larger than 1. This architecture effectively reduces the reference current through the reference signal generator 32 to be 1/k times as large as that through the reference signal generator 22 in the first embodiment, while maintaining the level of the reference signal REF "$V_{DD}-3.5 \cdot R_0 \cdot I_{ON}$". This implies that the power consumption of the reference signal generator 32 is reduce to be 1/k times as large as that in the first embodiment.

Second, P-channel MOS transistors P0 and P1 are disposed to enable and disable the currents through the D/A converter 31 and the reference signal generator 32. The MOS transistor P0 is disposed between the power source supply $V_{DD}$ and the resistor R0, and the MOS transistor P1 is disposed between the power source supply $V_{DD}$ and the resistor R1. An enable signal EN_B is provided for the gates of the MOS transistors P0 and P1. Activating the enable signal EN_B disables the currents through the D/A converter 31 and the reference signal generator 32 to reduce the power consumption of the majority circuit 30. One skilled in the art would appreciate that this provision of both of the MOS transistors P0 and P1 are preferable, but not necessary for reducing the power consumption.

Third, the non-inverting input of the differential amplifier 33 is precharged up to the level of the reference signal REF before the differential amplifier 33 is enabled to start comparing the levels of the sum signal SUM and the reference signal REF to improve the operation speed.

To achieve the precharge of the non-inverting input of the differential amplifier 33, a P-channel MOS transistor P2 is disposed between the inverting and non-inverting inputs of the differential amplifier 33. The P-channel MOS transistor P2 receives a precharge signal PRE_B on the gate thereof. To initiate the precharge of the non-inverting input, the precharge signal PRE_B is pulled down to the "low" level to turn on the MOS transistor P2. The turn-on of the MOS transistor P2 short-circuits the inverting and non-inverting inputs of the differential amplifier 33.

Preferably, the D/A converter 31 has a function to regulate the level of the sum signal SUM to that of the reference signal REF during precharge. The regulation of the sum signal SUM is achieved by providing a precharge current through the resistor R1 during precharge, the precharge current being 3.5 times as large as the current through each of the MOS transistors N10 to N17.

To regulate the level of the sum signal SUM to that of the reference signal REF during precharge, a precharge control circuit 37 is provided for the majority circuit 30. The precharge control circuit 37 includes an N-channel MOS transistor N09, an N-channel MOS transistor N19, 2-input NOR circuits NR0 to NR9, 2-input AND circuits AN5 to AN7, and an inverter IV8.

The MOS transistor N09 and N19 are connected in series between an earth terminal and the node 34, which is connected the drains of the MOS transistors N00 to N07. The gate of the MOS transistor N19 is connected to the drain of the MOS transistor N0 to receive the bias DACBIAS. The MOS transistor N0 and the MOS transistor N19 form a current mirror, a current mirror ratio $A_2$ of which is adjusted to be a half of the current mirror ratio $A_0$ with respect to the MOS transistors N10 to N17. This allows the current through the MOS transistor N19 to be a half of the current through each of the MOS transistor N10 to N17.

The gates of the MOS transistors N00 to N04 are respectively connected to the outputs of the NOR gates NR0 to NR4. First inputs of the NOR gates NR0 to NR4 receive a precharge signal PRE, which is complementary with the aforementioned precharge signal PRE_B, while second inputs of the NOR gates NR0 to NR4, denoted by numerals D0 to D4, respectively receives the data inversion signal $INVR_0$ to $INVR_4$, (or $INVF_0$ to $INVF_4$ for the majority circuit 30b).

The gates of the MOS transistors N05 to N07 are respectively connected to the outputs of the NOR gates NR5 to NR7. First inputs of the NOR gates NR5 to NR7 receives the enable signal EN_B, while second inputs of the NOR gates N05 to N07 are respectively connected to outputs of the AND gates AN5 to AN7. First inputs of the AND gate AN5 to AN7 receives the precharge signal PRE_B, while second inputs of the AND gate AN5 to AN7, denoted by numerals D5 to D7, respectively receives the data inversion signal $INVR_5$ to $INVR_7$ (or $INVF_5$ to $INVF_7$ for the majority circuit 30b).

The gate of the MOS transistor N08 receives the enable signal EN_B through the inverter IV8. The MOS transistor N08 is turned on when the enable signal EN_B is pulled down to the "low" level.

The gate of the MOS transistor N09 is connected to the NOR gate NR9. The first input of the NOR gate NR9 receives the enable signal EN_B, while the second input of the NOR gate NR9 receives the precharge signal PRE_B.

During precharge, the precharge signal PRE is pulled up to the "high" level after the enable signal EN_B is pulled down to the "low" level. In response to the precharge signal PRE being pulled up, the outputs of the NOR gates NR0 to NR4 are pulled down to the "low" level to turn off the MOS transistors N00 to N04. In the meantime, the outputs of the NOR gates NR5 to NR7, and NR9 are pulled up to the "high" level to turn on the MOS transistors N05 to N07 and N09. The turn-on of the MOS transistors N05 to N07 and N09 flows a current 3.5 as large as the turn-on current of each of the MOS transistors N00 to N07 through the resistor R0 to develop the sum signal SUM so that the level of the sum signal SUM is substantially identical to that of the reference signal REF.

FIGS. 9A to 9G are timing charts illustrating an operation of the majority circuits 30a and 30b assuming that data bits "0" and "1" are sequentially obtained from the memory array by each read circuit 1. The majority of the data bits "0" obtained by the read circuits 1, that is, five or more of the eight data bits "0", are flipped compared to the corresponding data bits "−1" previously obtained from the memory array, while four or less of the eight data bits "1" are flipped compared to the corresponding data bits "0".

As shown in FIG. 9B, in response to the initiation of the read cycle, the enable signal EN_B is pulled down to the "low" level. To initiate precharge of the non-inverting input of the differential amplifier 33, the precharge signal PRE is pulled up to the "high" level, while the precharge signal PRE_B is pulled down to the "low" level. In response to the pull-down to the precharge signal PRE_B, the non-inverting input, which receives the sum signal SUM, is short-circuited to the inverting input, which receives the reference signal REF. In addition, the MOS transistors N05 to N09 are turned on, while the MOS transistors N00 to N04 are turned off. This allows a current 3.5 times as large as the turn-on current of each of the MOS transistors N10 to N17 to flow through the resistor R0 so that the level of the sum signal SUM is substantially identical to that of the reference signal REF.

In synchronization with the falling edge of a clock pulse T2, as shown in FIG. 9D, the precharge signal PRE_B is pulled up to the "high" level to allow the majority circuit 30 to execute an majority operation to determine whether the majority of the data bits "0" are expected to be flipped compared to the corresponding data bits "−1". In response to the pull-up of the precharge signal PRE_B, the MOS transistor N09 is turned off. In addition, after the pull-up of the precharge signal PRE_B, the MOS transistors N00 to N07 are turned on or off in response to the respective levels of the inputs D0 to D7, that is, in response to the data inversion signals $INVR_0$ to $INVR_7$ (or $INVF_0$ to $INVR_7$), as shown in FIG. 9C.

As for the data bits "0", the majority operation is executed by the majority circuit 30a. Because the majority of the data bits "0" are expected to be flipped, three or less of the MOS transistors N00 to N07 in the majority circuit 30a are turned on. This initiates the increase in the level of the sum signal SUM from that of the reference signal REF. After the sufficient difference between the levels of the sum signal SUM the reference signal REF is obtained, the differential amplifier 33 is activated in the majority circuit 30a, and the activation of the differential amplifier 33 pulls up the output terminal JUDGE to the "high" level to develop the activated result signal DATAINVR. In response to the result signal DATAINVR is activated, the data bits "0" are respectively inverted by the read circuits 1 before outputted through the output terminals 15.

In order to prepare the following majority operation, the precharge signal PRE is pulled down to the "low" level, and the precharge signal is pulled up to the "high" level after the activation of the result signal DATAINVR for a certain duration. This initiates the precharge of the non-inverting input of the differential amplifier 33.

As for the following data bits "1", the majority operation is executed by the majority circuit 30b. In synchronization with the falling edge of the following clock pulse T3, the precharge signal PRE_B is pulled up to the "high" level to allow the majority circuit 30b to execute an majority operation to determine whether the majority of the data bits "1" are expected to be flipped compared to the corresponding data bits "0".

Because the majority of the data bits "1" are expected to be flipped, four or more of the MOS transistors N00 to N07 in the majority circuit 30b are turned on. This initiates the decrease in the level of the sum signal SUM from that of the reference signal REF. After the sufficient difference between the levels of the sum signal SUM the reference signal REF is obtained, the differential amplifier 33 is activated in the majority circuit 30b, and the activation of the differential amplifier 33 pulls up the output terminal JUDGE to the "high" level to develop the deactivated result signal DATAINVF. In response to the result signal DATAINVR is deactivated, the data bits "1" are outputted through the output terminals 15 without being inverted.

FIGS. 10A to 10G depict the effect of the precharge of the non-inverting input of the differential amplifier 33 on the improvement of the operation speed of the majority circuit 30. FIGS. 10A to 10C illustrate the waveforms of the signals within the majority circuit 16a (and 16b) shown in FIG. 3. while FIGS. 10D to 10G illustrate the waveforms of the signals within the majority circuit 30 shown in FIG. 8 in the second embodiment. The majority circuit 16a requires large transition of the level of the sum signal SUM immediately after the activation of the differential amplifier 33, while the majority circuit 30 requires small transition of the level of the sum signal SUM from the level of the reference signal REF. In addition, providing the D/A converter 31 with the function to actively regulate the level of the sum signal SUM effectively reduces necessary duration for achieving the precharge operation.

Third Embodiment

In a third embodiment, the majority circuit 16a and 16b are replaced with the majority circuit 40a and 40b shown in FIG. 11, in which like elements are denoted by like numerals. In the majority circuit 40a and 40b, pull-up transistors are used to develop the sum signal SUM and the reference signal REF in place of the load resistors R0 and R1 to improve the operation speed of the majority circuit 40a and 40b.

The majority circuits 40a and 40b have the same structure except for that the majority circuit 40a receives the data inversion signals $INVR_0$ to $INVR_7$ while the majority circuit 40b receives the data inversion signals $INVF_0$ to $INVF_7$, and that the majority circuits 40a outputs the result signal DATAINVR while the majority circuits 40b outputs the result signal DATAINVF. Therefore, each of the majority circuits 40a and 40b may be referred to as a majority circuit 40.

The majority circuit 40 includes a D/A converter 41, a reference signal generator 42, a differential amplifier 43 and a bias circuit 46.

The bias circuit 46 includes N-channel MOS transistors N0 and N1, and a P-channel MOS transistor P0, and a constant current source I0 providing the drain of the MOS transistor N0 with a constant current.

The MOS transistor N0 and the constant current source I0 are used to develop a constant bias BIAS_N. The source of the MOS transistor N0 is connected to an earth terminal, while the gate of the MOS transistor N0 are connected to the drain of the MOS transistor N0. The constant bias BIAS_N is developed on the drain of the MOS transistor N0.

The MOS transistor N1 and the MOS transistor N0 have the same characteristics, and they form a current mirror which provide a current through the MOS transistor N1 identical to the current through the MOS transistor N0. Because MOS transistor N0 and the MOS transistor P0 are connected in series between the power source supply $V_{DD}$ and an earth terminal, a current identical to the current through the MOS transistor N0 is developed through the MOS transistor P0. The drain of the MOS transistor P0 is connected to the gate thereof, and thus a constant bias BIAS_P is developed on the drain of the MOS transistor P0.

The D/A converter 41 includes N-channel MOS transistors N00 to N07, N09, N10 to N17, N19, P-channel MOS transistors P00 to P07, and P10 to P17. The drains of the MOS transistors N00 to N07 are connected to a node 44. The MOS transistors N10 to N17 are respectively connected between earth terminals and the sources of the MOS transistors N00 to N07. The gates of the MOS transistors N10 to N17 are connected to the drain of the MOS transistor N0 to form a first current mirror.

The drains of the MOS transistors P00 to P07 are connected to the node 44. The MOS transistors P10 to P17 are respectively connected between the power supply source $V_{DD}$ and the sources of the MOS transistors P00 to P07. The gates of the MOS transistors N10 to N17 are connected to the drain of the MOS transistor P0 to form a second current mirror.

To make the currents through the MOS transistors P10 to P17 identical to those through MOS transistors N10 to N17, the current mirror ratio of the current mirror formed by the MOS transistor P0 and the MOS transistors P10 to P17 is adjusted to be identical to that of the current mirror formed by the MOS transistor N0 and the MOS transistors N10 to N17. The current mirror ratio of the first and second current mirrors are referred to as a mirror ratio $A_0$.

The gates of the MOS transistors N00 to N07 and P00 to P07 are respectively connected to inputs /D0 to /D7. The inputs /D0 to /D7 respectively receive the data inversion signals $INVR_0$ to $INVR_7$ (or $INVF_0$ to $INVF_7$) through inverters (not shown), the inverted data inversion signal $INVR_0$ to $INVR_7$ being denoted by numerals $/INVR_0$ to $/INVR_7$ (or $/INVF_0$ to $/INVF_7$) in FIG. 11. The total pull-up current into the node 44 and the total pull-down current from the node 44 depends on the number of the activated ones of the data inversion signals $/INVR_0$ to $/INVR_7$ (or $/INVF_0$ to $/INVF_7$). The level of the sum signal SUM, developed on the node 44, is determined in response to the difference between the total pull-up current and the total pull-down current.

The MOS transistors N09 and N19 are connected in series between the node 44 and an earth terminal. The gate of the MOS transistor N09 is connected to the power source supply $V_{DD}$. The gate of the MOS transistor N19 is connected to the drain of the MOS transistor N0 to form a current mirror, the current mirror ratio of which is identical to the aforementioned mirror ratio $A_0$.

The MOS transistors N09 and N19 effectively avoid the level of the sum signal SUM being unstable when the number of the activated ones of the data inversion signals $/INVR_0$ to $/INVR_7$ (or $/INVF_0$ to $/INVF_7$) is identical to the deactivated ones, that is, when the number of the activated data inversion signals is four.

The reference signal generator 42 includes N-channel MOS transistors N08 and N18, and P-channel MOS transistors P08 and P18. The N-channel MOS transistors N08 and N18 are connected in series between a node 45 and an earth terminal, while the P-channel MOS transistors P08 and P18 are connected in series between the node 45 and a power source supply $V_{DD}$. A reference signal REF is developed on the node 45 connected to the inverting input of the differential amplifier 43.

The gate of the MOS transistor N08 is connected to the drain of the MOS transistor N0 to form a third current mirror, while the gate of the MOS transistor P08 is connected to the drain of the MOS transistor P0 to form a fourth current mirror. The current mirror ratios of the third and fourth current mirrors are adjusted to be 4.5 times as large as the aforementioned mirror ratio $A_0$ of the current mirror formed by the MOS transistors N0 and N10 to N17 (and that formed by the MOS transistors P0 and P10 to P17).

FIG. 12 shows the association of the number of the activated one of the data inversion signals INVR (or INVF) to the levels of the sum signal SUM and the reference signal REF. It should be noted that the number of the activated one of the data inversion signals INVR (or INVF) corresponds to the number of the data bits outputted at the current clock cycle from the read circuits 1 that will be flipped compared to the corresponding to the number of the data bits outputted at the previous clock cycle (see FIG. 2). In FIG. 12, $V_{DOWN+k}$ represents the potential developed on the node 44 by k pull-down transistors (that is, k pairs of the N-channel MOS transistors N0i and N1i), $V_{UP+k}$ represents the potential developed on the node 44 by k pull-up transistors (that is, k pairs of the P-channel MOS transistors P0i to P1i), and $V_{\pm 0}$ represents the potential developed on the node 45 by the same number of the pull-up and pull-down transistors.

FIG. 12 depicts that comparing the level of the sum signal SUM to that of the reference signal REF achieves the majority operation on the data inversion signals INVR (or INVF).

The architecture shown in FIG. 11 effectively improves the operation speed of the majority circuit, because both of the pull-up and pull-down of the level of the sum signal SUM are actively achieved by MOS transistors.

Fourth Embodiment

Figure 13:
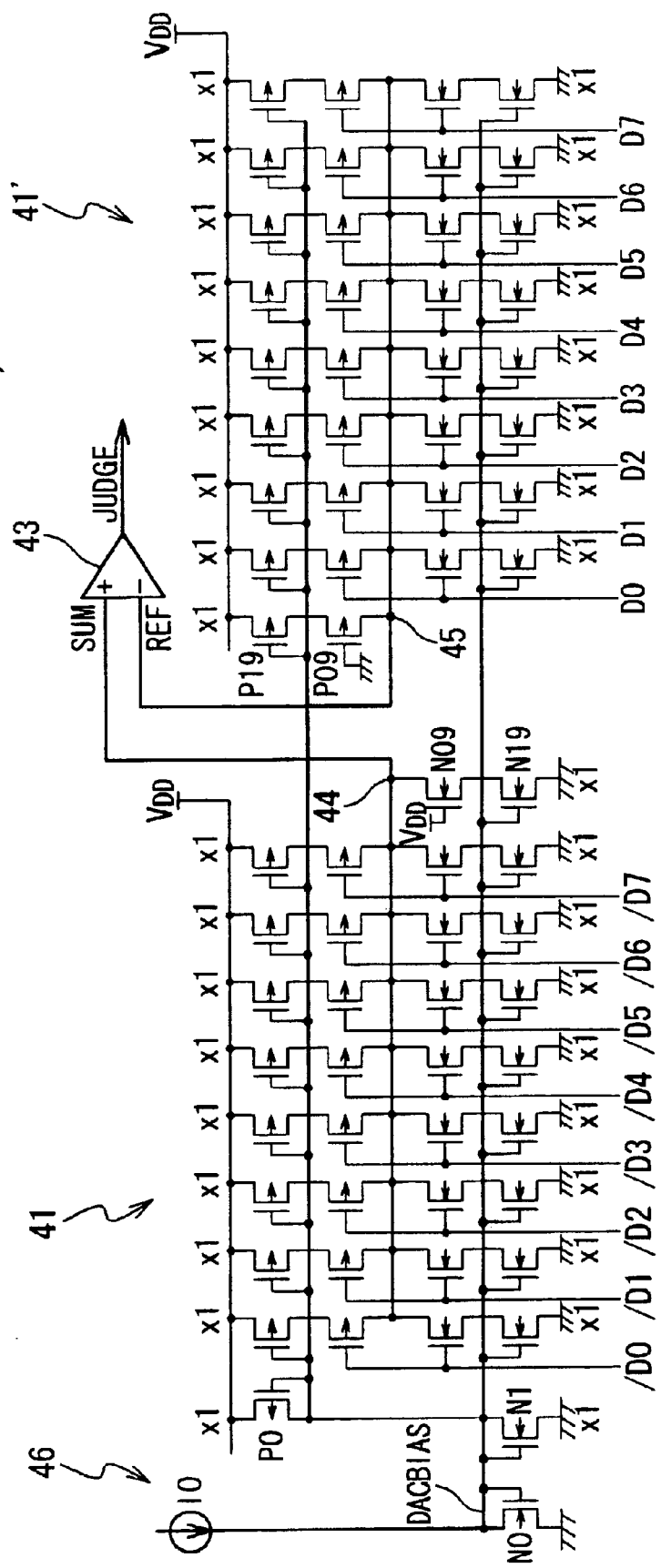
FIG. 13 shows a circuit diagram of a majority circuit in a fourth embodiment.

In a fourth embodiment, as shown in FIG. 13, the majority circuit 40a' and 40b' are used in placed of the majority circuits 40a and 40b shown in the FIG. 11. The majority circuit 40a' and 40b' are similar to the majority circuits 40a and 40b except for that the reference circuit 42 is replaced with a D/A converter 41' connected to the node 45. The D/A converter 41' receives input signals complimentary to those of the D/A converter 41, while developing an output signal complimentary to that of the D/A converter 41.

In detail, the D/A converter 41' is identical to the D/A converter 41 except for that the MOS transistors N00 to N07 and P00 to P07 receives a set of signals on inputs D0 to D7, the signals being complimentary to those received on the inputs /D0 to /D7, and that the N-channel MOS transistors N09 and N19 are replaced with P-channel MOS transistors P09 and P19 connected between a power source supply $V_{DD}$ and the node 45. In other words, the majority circuit 40a' receives the data inversion signals $INVR_0$ to $INVR_7$ on the inputs D0 to D7, respectively, while the majority circuit 40b' receives the data inversion signals $INVF_0$ to $INVF_7$ on the inputs D0 to D7. The MOS transistor P09 is connected to an earth terminal to receive a signal complimentary to that received by the MOS transistors N09. The gate of the MOS transistor P19 is connected to the drain of the MOS transistor P0.

FIG. 14 shows the association of the number of the activated one of the data inversion signals INVR (or INVF) to the levels of the sum signal SUM and the reference signal REF. In FIG. 14, $V_{DOWN+k}$ represents the potential developed on the node 44 (or the node 45) by k pull-down transistors, and $V_{UP+k}$ represents the potential developed on the node 44 (or the node 45) by k pull-up transistors.

FIG. 14 depicts that comparing the level of the sum signal SUM to that of the reference signal REF achieves the majority operation on the data inversion signals INVR (or INVF) in the fourth embodiment.

The architecture shown in FIG. 14 effectively makes the operation margin of the differential amplifier 43 in the fourth embodiment twice as large as that in the third embodiment because of the use of the D/A converter 41' which is complimentary to the D/A converter 41.

One skilled in the art would appreciate that the same goes for the majority circuits shown in FIGS. 3, and 8. Reference back to FIG. 3, for example, the reference signal generator 22 may be replaced with a D/A converter identical to the D/A converter 21 except for that the MOS transistors N00 to N07 receives input signals complimentary to those received by the D/A converter 21, that is, receives the data inversion signals $INVR_0$ to $INVR_7$ (or $INVF_0$ to $INVF_7$).

Figure 15:
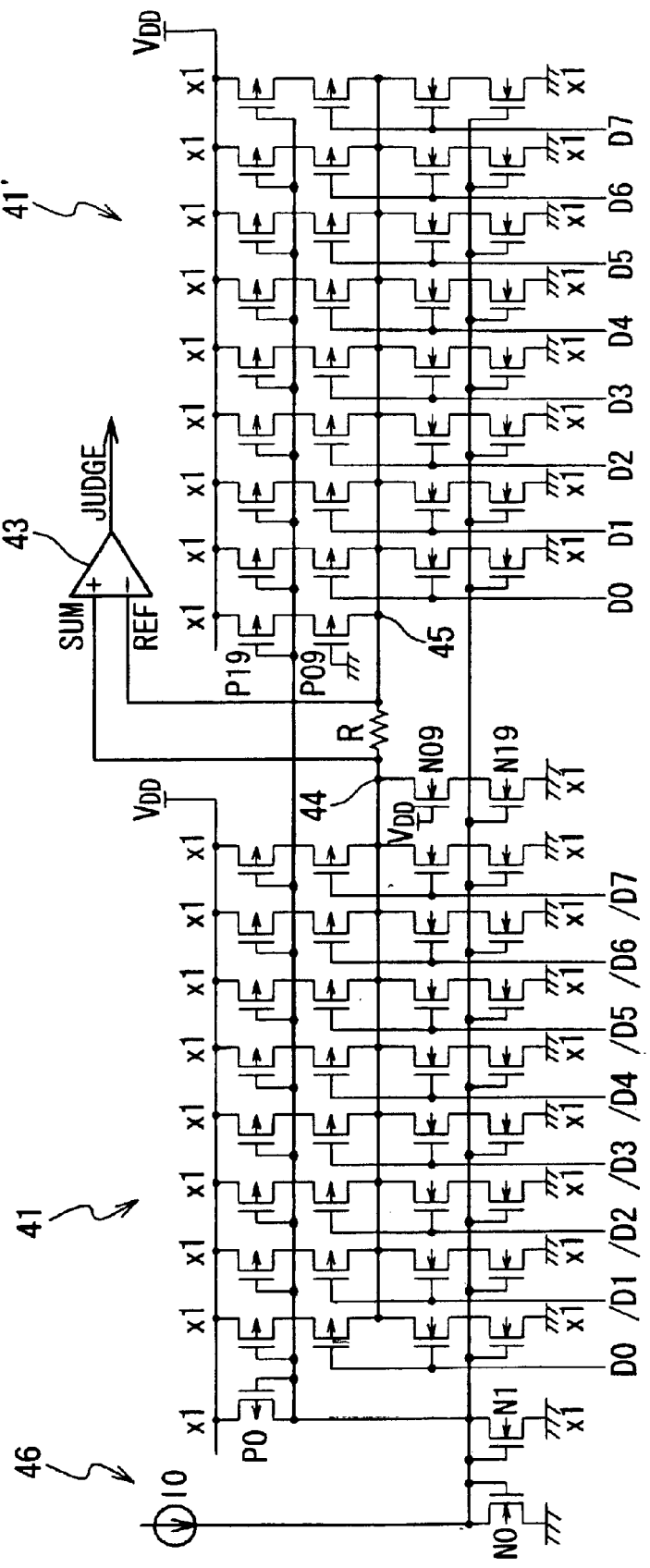
FIG. 15 shows a modification of the majority circuit in the fourth embodiment.

As shown in FIG. 15, a resistor R is preferably disposed between the nodes 44 and 45. The resistor R allows a current to flow from the node 44 to the node 45 in the event that the number of the activated ones of the data inversion signals INVR (or INVF) are equal to or less than 4, while allowing a current flow from the node 45 to the node 44. This develops a sufficient voltage across the resistor R to ensure the operation of the majority circuits 40a and 40b.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

Especially, it should be noted that the number of the inputs of the majority circuit is not limited to eight. The number of the MOS transistors receiving the data inversion signals and the level of the reference signal REF may be modified in accordance with the number of the inputs of the majority circuit.

In addition, the majority circuit disclosed herein may be used within integrated circuits other than the circuitry for the data inversion.

What is claimed is:

1. A majority circuit comprising:
   a D/A converter converting a plurality of binary signals to an analogue signal,
   a majority determining circuit responsive to said analogue signal to achieve a majority operation on said plurality of binary signals to produce a result signal representative of a result of said majority operation.

2. The majority circuit according to claim 1, wherein said majority determining circuit includes:
   a reference signal generator generating a reference signal representative of a threshold of said majority operation;
   a differential amplifier responsive to said analogue signal and said reference signal to develop said result signal.

3. The majority circuit according to claim 2, wherein said D/A converter includes:
   a load resistor connected to a node;
   a plurality of input transistors each connected to said node, said plurality of input transistors being responsive to said plurality of binary signals, respectively, for allowing currents to flow therethrough to develop said analogue signal on said node.

4. The majority circuit according to claim 3, wherein said D/A converter further includes a switching element which enables a current through said load resistor in response to an enable signal.

5. The majority circuit according to claim 3, wherein said reference signal generator includes:
   a reference load resistor connected to a reference node;
   a reference transistor connected to said reference node, said reference transistor allowing a reference current to flow therethrough to develop said reference signal on said reference node.

6. The majority circuit according to claim 5, wherein said reference signal generator further includes a switching element which enables a current through said reference load resistor in response to an enable signal.

7. The majority circuit according to claim 2, wherein said reference circuit includes:
   first and second resistor elements connected in series between a power source supply and an earth terminal, and
   a reference node disposed between said first and second resistor, and
   wherein said reference signal is developed on said reference node.

8. The majority circuit according to claim 2, wherein said reference signal is generated by an internal power source integrated within a same semiconductor within which said majority circuit is integrated.

9. A majority circuit comprising:
a D/A converter converting a plurality of binary signals to an analogue signal, and
a majority determining circuit responsive to said analogue signal to achieve a majority operation on said plurality of binary signals to produce a result signal representative of a result of said majority operation, wherein said D/A converter includes:
a load resistor connected to a node; and
a plurality of input transistors each connected to said node, said plurality of input transistors being responsive to said plurality of binary signals, respectively, for allowing currents to flow therethrough to develop said analogue signal on said node, and wherein said reference signal generator includes:
a reference load resistor connected to a reference node; and
a reference transistor connected to said reference node, said reference transistor allowing a reference current to flow therethrough to develop said reference signal on said reference node, and further comprising a bias circuit,
wherein said D/A converter further includes a plurality of first current mirror transistors respectively connected in series to said input transistors,
wherein said reference signal generator further includes a second current mirror transistor connected in series to said reference transistor, and
wherein said bias circuit provides a bias for each of said plurality of first current mirror transistors and said second current mirror transistor to control currents through said plurality of first current mirror transistors and said second current mirror transistors.

10. The majority circuit according to claim 9, wherein said bias circuit includes a bias transistor which forms a first current mirror with said plurality of first current mirror transistors, and forms a second current mirror with said second current mirror transistor,
wherein a current mirror ratio of said second current mirror is 1/k times as large as a current mirror ratio of said first current mirror, said k being larger than 1, and
wherein a resistance of said reference load resistor is k times as large as a resistance of said load resistor within said D/A converter.

11. A majority circuit comprising:
a D/A converter converting a plurality of binary signals to an analogue signal, and
a majority determining circuit responsive to said analogue signal to achieve a majority operation on said plurality of binary signals to produce a result signal representative of a result of said majority operation, wherein said majority determining circuit includes:
a reference signal generator generating a reference signal representative of a threshold of said majority operation; and
a differential amplifier responsive to said analogue signal and said reference signal to develop said result signal, and
further comprising a precharge switching element, wherein said differential amplifier includes first and second inputs respectively receiving said analogue signal and said reference signal,
wherein said precharge switching element is disposed between said first and second inputs, and
wherein said precharge switching element is turned on to short-circuit said first and second inputs before said differential amplifier is enabled.

12. A majority circuit comprising:
a D/A converter converting a plurality of binary signals to an analogue signal, and
a majority determining circuit responsive to said analogue signal to achieve a majority operation on said plurality of binary signals to produce a result signal representative of a result of said majority operation, wherein said majority determining circuit includes:
a reference signal generator generating a reference signal representative of a threshold of said majority operation; and
a differential amplifier responsive to said analogue signal and said reference signal to develop said result signal, and
wherein said D/A converter includes a precharge control circuit which regulates a level of said analogue signal to that of said reference signal before said differential amplifier is enabled.

13. A majority circuit comprising:
a D/A converter converting a plurality of binary signals to an analogue signal, and
a majority determining circuit responsive to said analogue signal to achieve a majority operation on said plurality of binary signals to produce a result signal representative of a result of said majority operation, wherein said majority determining circuit includes:
a reference signal generator generating a reference signal representative of a threshold of said majority operation; and
a differential amplifier responsive to said analogue signal and said reference signal to develop said result signal, and
wherein said reference signal generator includes another D/A converter which receives complimentary input signals complimentary to said plurality of binary signals to output said reference signal so that said reference signal is complimentary to said analogue signal.

14. The majority signal generator according to claim 13, further comprising a resistor element, wherein said differential amplifier includes first and second inputs respectively receiving said analogue signal and said reference signal, and
wherein said resistor element is disposed between said first and second inputs.

15. A majority circuit comprising:
a D/A converter converting a plurality of binary signals to an analogue signal, and
a majority determining circuit responsive to said analogue signal to achieve a majority operation on said plurality of binary signals to produce a result signal representative of a result of said majority operation, wherein said majority determining circuit includes:
a reference signal generator generating a reference signal representative of a threshold of said majority operation; and
a differential amplifier responsive to said analogue signal and said reference signal to develop said result signal, and
wherein said D/A converter includes:
a node on which said analogue signal is developed,
a plurality of first input transistors for pulling up said node in response to said plurality of binary signals, respectively, and a plurality of second input transistors for pulling down said node in response to said plurality of binary signals, respectively.

16. The majority circuit according to claim 15, wherein said reference signal generator includes:
   a reference node on which said reference signal is developed,
   a plurality of first reference transistors for pulling up said reference node in response to a plurality of complimentary signals complimentary to said plurality of binary signals, respectively, and
   a plurality of second reference transistors for pulling down said reference node in response to said plurality of complimentary signals, respectively.

17. The majority circuit according to claim 16, further comprising a resistor element, wherein said differential amplifier includes first and second inputs respectively receiving said analogue signal and said reference signal, and
   wherein said resistor element is disposed between said first and second inputs.

18. The majority circuit according to claim 15, further comprising a bias circuit, wherein said D/A converter further includes:
   a plurality of first current mirror transistors connected in series to said plurality of first input transistors, respectively, and
   a plurality of second current mirror transistors connected in series to said plurality of second input transistors, respectively, and wherein said bias circuit provides a first bias for said plurality of first current mirror transistors and a second bias for said plurality of second current mirror transistors so that currents through said plurality of first current mirror transistors are identical to currents through said plurality of second current mirror transistors.

19. The majority circuit according to claim 18, wherein said reference signal generator includes:
   a reference node on which said reference signal is developed,
   a plurality of first reference transistors for pulling up said reference node in response to a plurality of complimentary signals complimentary to said plurality of binary signals, respectively, and
   a plurality of second reference transistors for pulling down said reference node in response to said plurality of complimentary signals, respectively,
   a plurality of third current mirror transistors connected in series to said plurality of first reference transistors, respectively, and
   a plurality of fourth current mirror transistors connected in series to said plurality of second reference transistors, respectively, and
   wherein said bias circuit provides said first bias for said plurality of third current mirror transistors, and said second bias for said plurality of fourth current mirror transistors so that currents through said plurality of third and fourth current mirror transistors are identical to said currents through said plurality of first and second current mirror transistors.

* * * * *

(12) EX PARTE REEXAMINATION CERTIFICATE (6445th)
United States Patent
Nakagawa et al.

(10) Number: US 6,798,367 C1
(45) Certificate Issued: Sep. 16, 2008

(54) SIZE-REDUCED MAJORITY CIRCUIT

(75) Inventors: Hiroshi Nakagawa, Tokyo (JP); Kanji Oishi, Tokyo (JP)

(73) Assignee: Elpida Memory, Inc, Chuo-Ku, Tokyo (JP)

Reexamination Request:
No. 90/007,779, Oct. 21, 2005

Reexamination Certificate for:
Patent No.: 6,798,367
Issued: Sep. 28, 2004
Appl. No.: 10/456,355
Filed: Jun. 5, 2003

(30) Foreign Application Priority Data

Jun. 6, 2002 (JP) ................................. 2002-166210

(51) Int. Cl.
 H03K 19/23 (2006.01)
 H03K 19/20 (2006.01)
 H03M 1/66 (2006.01)

(52) U.S. Cl. .................. 341/144; 341/155; 341/160; 345/204; 345/96; 365/200

(58) Field of Classification Search ................. 341/144, 341/154
See application file for complete search history.

(56) References Cited

U.S. PATENT DOCUMENTS 5,838,166 A * 11/1998 Nakamura .................. 326/36

6,320,409 B1 11/2001 Nakajima et al.

FOREIGN PATENT DOCUMENTS

| JP | 63-171023 | 7/1988 |
| JP | 64-013812 | 1/1989 |
| JP | 04094220 A * | 3/1992 |
| JP | 4-156108 | 5/1992 |
| JP | 7-20973 | 1/1995 |
| JP | 10-93424 | 4/1998 |
| JP | 2001-230665 | 8/2001 |
| JP | 2001-307479 | 11/2001 |

OTHER PUBLICATIONS

Japanese Office Action dated Feb. 17, 2006, with partial translation, for corresponding Japanese Application 2002–166210.

Korean Office Action dated Dec. 23, 2004, with a partial translation.

* cited by examiner

*Primary Examiner*—Pia Tibbits

(57) ABSTRACT

A majority circuit for reduce a size thereof is provided. The majority circuit is composed of a D/A converter converting a plurality of binary signals to an analogue signal, a majority determining circuit responsive to said analogue signal to achieve a majority operation on said plurality of binary signals to produce a result signal representative of a result of said majority operation.

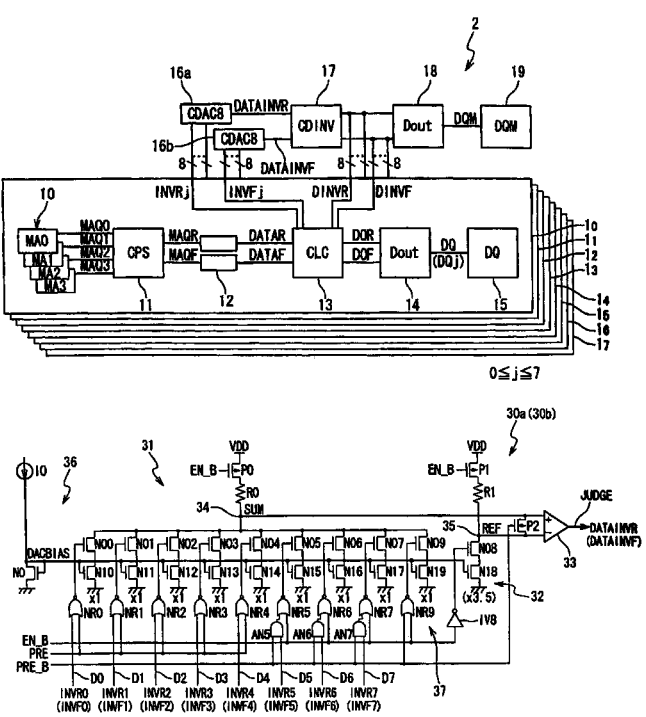

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 11 and 12 is confirmed.

Claims 2, 3, 5, 7–9, 13, 15 and 16 are cancelled.

Claims 1, 14, 17 and 18 are determined to be patentable as amended.

Claims 4, 6, 10 and 19, dependent on an amended claim, are determined to be patentable.

1. A majority circuit comprising:
   a D/A converter converting a plurality of binary signals to an analogue signal, *and*
   a majority determining circuit responsive to said analogue signal to achieve a majority operation on said plurality of binary signals to produce a result signal representative of a result of said majority operation,
   *wherein said majority determining circuit includes a reference signal generator generating a reference signal representative of a threshold of said majority operation, and a differential amplifier responsive to said analogue signal and said reference signal to develop said result signal;*
   *wherein said D/A converter includes a load resistor connected to a node, and a plurality of input transistors each connected to said node, said plurality of input transistors being responsive to said plurality of binary signals, respectively, for allowing currents to flow therethrough to develop said analogue signal on said node;*
   *wherein said reference signal generator includes a reference load resistor connected to a reference node, and a reference transistor connected to said reference node, said reference transistor allowing a reference current to flow therethrough to develop said reference signal on said reference node, and further comprising a bias circuit;*
   *wherein said D/A converter further includes a plurality of first current mirror transistors respectively connected in series to said input transistors;*
   *wherein said reference signal generator further includes a second current mirror transistor connected in series to said reference transistor; and*
   *wherein said bias circuit provides a bias for each of said plurality of first current mirror transistors and said second current mirror transistor to control currents through said plurality of first current mirror transistors and said second current mirror transistor.*

4. The majority circuit according to claim [3] *1*, wherein said D/A converter further includes a switching element which enables a current through said load resistor in response to an enable signal.

6. The majority circuit according to claim [5] *1*, wherein said reference signal generator further includes a switching element which enables a current through said reference load resistor in response to an enable signal.

10. The majority circuit according to claim [9] *1*, wherein said bias circuit includes a bias transistor which forms a first current mirror with said plurality of first current mirror transistors, and forms a second current mirror with said second current mirror transistor,
   wherein a current mirror ratio or said second current mirror is 1/k times as large as a current mirror ratio of said first current mirror, said k being larger than 1, and
   wherein a resistance of said reference load resistor is k times as large as a resistance of said load resistor within said D/A converter.

14. [The] *A* majority [signal generator according to claim 13, further] *circuit* comprising*:*
   *a D/A converter converting a plurality of binary signals to an analogue signal;*
   *a majority determining circuit responsive to said analogue signal to achieve a majority operation on said plurality of binary signals to produce a result signal representative of a result of said majority operation; and*
   a resistor element, wherein said differential amplifier includes first and second inputs respectively receiving said analogue signal and said reference signal, [and]
   wherein said resistor element is disposed between said first and second inputs,
   *wherein said majority determining circuit includes:*
      *a reference signal generator generating a reference signal representative of a threshold of said majority operation, and*
      *a differential amplifier responsive to said analogue signal and said reference signal to develop said result signal, and*
   *wherein said reference signal generator includes another D/A converter which receives complimentary input signals complimentary to said plurality of binary signals to output said reference signal so that said reference signal is complimentary to said analogue signal.*

17. [The] *A* majority circuit [according to claim 16, further] comprising*:*
   *a D/A converter converting a plurality of binary signals to an analogue signal;*
   *a majority determining circuit responsive to said analogue signal to achieve a majority operation on said plurality of binary signals to produce a result signal representative of a result of said majority operation; and*
   a resistor element, wherein said differential amplifier includes first and second inputs respectively receiving said analogue signal and said reference signal, [and]
   wherein said resistor element is disposed between said first and second inputs*;*
   *wherein said majority determining circuit includes:*
      *a reference signal generator generating a reference signal representative of a threshold of said majority operation; and*
      *a differential amplifier responsive to said analogue signal and said reference signal to develop said result signal, and* wherein said D/A converter includes:
  a node on which said analogue signal is developed, a plurality of first input transistors for pulling up said node in response to said plurality of binary signals, respectively, and
  a plurality of second input transistors for pulling down said node in response to said plurality of binary signals, respectively,
wherein said reference signal generator includes:
  a reference node on which said reference signal is developed,
  a plurality of first reference transistors for pulling up said reference node in response to a plurality of complimentary signals complimentary to said plurality of binary signals, respectively, and
  a plurality of second reference transistors for pulling down said reference node in response to said plurality of complimentary signals, respectively.

18. [The] *A* majority circuit [according to claim 15, further] *comprising:*
  *a D/A converter converting a plurality of binary signals to an analogue signal;*
  *a majority determining circuit responsive to said analogue signal to achieve a majority operation on said plurality of binary signals to produce a result signal representative of a result of said majority operation; and*
  a bias circuit, wherein said D/A converter further includes:
  a plurality of first current mirror transistors connected in series to said plurality of first input transistors, respectively, and
  a plurality of second current mirror transistors connected in series to said plurality of second input transistors, respectively, [and]
wherein said bias circuit provides a first bias for said plurality of first current mirror transistors and a second bias for said plurality of second current mirror transistors so that currents through said plurality of first current mirror transistors are identical to currents through said plurality of second current mirror transistors,

*wherein said majority determining circuit includes:*
  *a reference signal generator generating a reference signal representative of a threshold of said majority operation; and*
  *a differential amplifier responsive to said analogue signal and said reference signal to develop said result signal, and*
*wherein said D/A converter includes:*
  *a node on which said analogue signal is developed, a plurality of first input transistors for pulling up said node in response to said plurality of binary signals, respectively, and*
  *a plurality of second input transistors for pulling down said node in response to said plurality of binary signals, respectively.*

* * * * *